United States Patent
Singh et al.

(10) Patent No.: US 9,680,461 B1
(45) Date of Patent: Jun. 13, 2017

(54) GENERATING LOCAL OSCILLATOR SIGNALS IN A WIRELESS SENSOR DEVICE

(71) Applicant: Cognitive Systems Corp., Waterloo (CA)

(72) Inventors: Rahul Singh, Oakville (CA); Trevor Pace, Waterloo (CA); Tajinder Manku, Waterloo (CA)

(73) Assignee: Cognitive Systems Corp., Waterloo, Ontario (CA)

( * ) Notice: Subject to any disclaimer, the term of this patent is extended or adjusted under 35 U.S.C. 154(b) by 0 days.

(21) Appl. No.: 15/057,921

(22) Filed: Mar. 1, 2016

(51) Int. Cl.
| | |
|---|---|
| *H03K 5/156* | (2006.01) |
| *H03K 7/06* | (2006.01) |
| *H04B 1/16* | (2006.01) |
| *H04B 1/04* | (2006.01) |

(52) U.S. Cl.
CPC ............ *H03K 5/1565* (2013.01); *H03K 7/06* (2013.01); *H04B 1/0483* (2013.01); *H04B 1/16* (2013.01)

(58) Field of Classification Search
CPC .......... H03K 5/1565; H03K 7/06; H04B 1/16; H04B 1/0483; H03B 21/01; H03L 7/18; H04L 7/033
See application file for complete search history.

(56) References Cited

U.S. PATENT DOCUMENTS

| | | | |
|---|---|---|---|
| 6,166,571 A | 12/2000 | Wang | |
| 6,282,413 B1 | 8/2001 | Baltus | |
| 6,915,117 B2 | 7/2005 | Chominski et al. | |
| 7,099,643 B2 | 8/2006 | Lin | |
| 7,656,205 B2 | 2/2010 | Chen et al. | |
| 8,169,270 B2 | 5/2012 | Zeng et al. | |
| 2003/0016600 A1* | 1/2003 | Hiratsuka | G11B 7/0906 369/44.34 |
| 2005/0212570 A1 | 9/2005 | Sun et al. | |
| 2007/0178869 A1* | 8/2007 | Park | H04B 1/0082 455/260 |
| 2008/0174349 A1* | 7/2008 | Luo | H03L 7/193 327/157 |
| 2008/0285625 A1* | 11/2008 | Chang | H03L 7/183 375/132 |

(Continued)

OTHER PUBLICATIONS

Johnson, Mark G.; A Symmetric CMOS nor Gate for High-Speed Applications; IEEE Journal on Solid-State Circuits; vol. 23, No. 5; Oct. 1988; Piscataway, NJ; US; 4 pages.

(Continued)

*Primary Examiner* — Syed Haider
(74) *Attorney, Agent, or Firm* — Henry Patent Law Firm PLLC

(57) ABSTRACT

In some aspects, a local oscillator includes a voltage controlled oscillator, a multi-stage frequency divider including first and second stages, and a duty-cycle converter. An output node of the voltage controlled oscillator is coupled to an input node of the first stage. An output node of the first stage is coupled to an input node of the second stage. The first stage is configured to output a first signal from one of a first plurality of signal paths, each configured to provide a signal having a distinct frequency. The second stage is configured to output a second signal from one of a second plurality of signal paths, each configured to provide a signal having a distinct frequency. An output node of the multi-stage frequency divider is coupled to an input node of the duty-cycle converter.

19 Claims, 12 Drawing Sheets

(56) References Cited

U.S. PATENT DOCUMENTS

| | | |
|---|---|---|
| 2009/0121763 A1 | 5/2009 | Bossu et al. |
| 2009/0239592 A1* | 9/2009 | Deng ................. H04B 1/16 |
| | | 455/574 |
| 2009/0296878 A1* | 12/2009 | Tsai .................. H03K 23/667 |
| | | 377/47 |
| 2011/0043291 A1 | 2/2011 | Fagg |
| 2013/0012150 A1 | 1/2013 | Panikkath et al. |
| 2013/0271188 A1 | 10/2013 | Chan |
| 2014/0266361 A1* | 9/2014 | Shashidharan ...... H03K 5/1565 |
| | | 327/175 |
| 2015/0008968 A1* | 1/2015 | Ma ...................... H03K 5/1565 |
| | | 327/175 |

OTHER PUBLICATIONS

Rategh, et al; A CMOS Frequency Synthesizer with an Injection-Locked Frequency Divider for a 5-GHz Wireless LAN Receiver; IEEE Journal Solid-State Circuits; vol. 35, No. 5; May 2000; Piscataway, NJ; US; 8 pages.

Canadian Intellectual Property Office, International Search Report and Written Opinion for International Application No. PCT/CA2016/051463 issued on Mar. 17, 2017, 11 pages.

\* cited by examiner

GENERATING LOCAL OSCILLATOR SIGNALS IN A WIRELESS SENSOR DEVICE

BACKGROUND

The following description relates to generating local oscillator signals in a wireless sensor device.

Many wireless devices detect radio frequency (RF) signals and down-convert them to a lower frequency for signal processing. Many wireless devices can also up-convert baseband signals to a higher frequency for signal transmission. The signals can be up-converted or down-converted by a mixer that uses a reference signal from a local oscillator. The local oscillator may include a voltage controlled oscillator that generates the reference signal.

DETAILED DESCRIPTION

The following description relates generally to local oscillators (LOs). The example local oscillators described here can be used, for example, in a wireless sensor device, or in other contexts. In some cases, the techniques and systems described here are used in integrated circuit RF transmitters, receivers and transceivers for a wide-band, multi-standard radio applications.

In some implementations, a local oscillator includes a voltage controlled oscillator (VCO), and circuitry that is changeable to produce any of multiple different frequency outputs based on the VCO signal. For example, the circuitry can include a frequency divider circuit that can divide the frequency of the VCO signal by an integer (e.g., 2, 4, 8, or another integer) that is controlled by control signals. In some cases, the frequency divider circuit has a single output node that can provide references signals at multiple different frequencies (e.g., $f_{VCO}/2$, $f_{VCO}/4$, $f_{VCO}/8$, etc., where $f_{VCO}$ represents the frequency of the VCO signal). For example, the output node may be communicatively coupled to a duty-cycle converter that generates an output of the local oscillator based on the reference signal from the frequency divider circuit. In some cases, the frequency divider circuit has a single input node that receives the VCO signal at the VCO frequency ($f_{VCO}$). The frequency divider may also include switches that receive the control signals, and circuitry that generates the reference signal from the VCO signal. In some examples, the frequency of the reference signal produced by the frequency divider circuit (e.g., $f_{VCO}/2$, $f_{VCO}/4$, $f_{VCO}/8$, etc.) is a quotient of the VCO frequency and a divisor controlled by the control signals. In some examples, the frequency divider circuit is a multi-stage frequency divider that divides the frequency of the VCO signal in a series of stages.

In some implementations, the subject matter described here provides advantages, such as, for example, reducing hardware requirements (e.g., requiring fewer mixers, fewer duty-cycle converters), allowing for a broader range of hardware (e.g., symmetric NOR logic gates), and others. For instance, in some cases, fewer mixers and fewer duty-cycle converters are used for frequency up-conversion or down-conversion across a broad range of frequencies, which can simplify metal routing, reduce a number of transistors used, and reduce circuit area.

Figure 1:
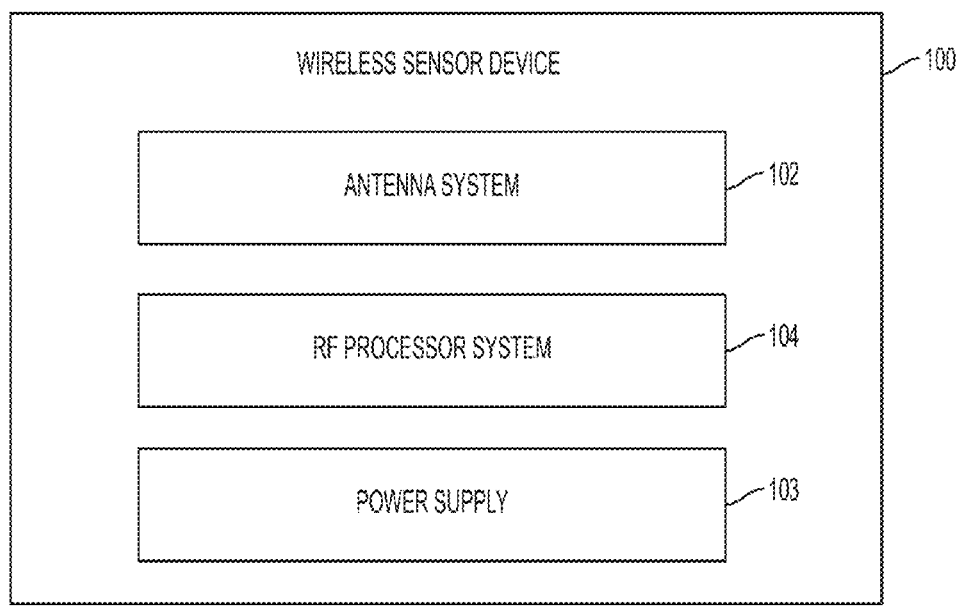
FIG. 1 is a block diagram showing an example wireless sensor device.

FIG. 1 is a block diagram showing an example wireless sensor device 100. As shown in FIG. 1, the wireless sensor device 100 includes an antenna system 102, a radio frequency (RF) processor system 104, and a power supply 103. A wireless sensor device may include additional or different features and components, and the components can be arranged as shown or in another manner.

In operation, the wireless sensor device 100 can detect and analyze wireless signals. In some implementations, the wireless sensor device 100 can detect signals exchanged according to a wireless communication standard (e.g., for a cellular network), although the wireless sensor device itself may not be part of the cellular network. In some instances, the wireless sensor device 100 monitors RF signals by "listening" or "watching" for RF signals over a broad range of frequencies and processing the RF signals that it detects. There may be times when no RF signals are detected, and the wireless sensor device 100 may process RF signals (e.g., from time to time or continuously) as they are detected in the local environment of the wireless sensor device 100.

The example antenna system 102 is coupled with the RF processor system 104, for example, by wires, leads, contacts or another type of coupling that allows the antenna system 102 and the RF processor system 104 to exchange RF signals. In some instances, the antenna system 102 wirelessly receives RF signals from the electromagnetic environment of the wireless sensor device 100 and transfers the RF signals to the RF processor system 104 to be processed (e.g., digitized, analyzed, stored, retransmitted, etc.). In some instances, the antenna system 102 receives RF signals from the RF processor system 104 and wirelessly transmits the RF signals from the wireless sensor device 100.

The example RF processor system 104 can include circuitry that up-converts a baseband signal to an RF signal, that down-converts an RF signal to a baseband signal, or both. Such circuitry can include mixers that utilize a reference signal provided by a local oscillator, which can include a voltage controlled oscillator (VCO). For instance, in some implementations, the RF processor system 104 includes the example local oscillator 400 shown in FIG. 4, the example local oscillator shown in FIGS. 7 and 8, or another type of local oscillator. In some examples, a baseband signal can be input into a mixer that also receives an RF reference signal from a local oscillator. The mixer can up-convert the baseband signal to an RF signal. In some examples, an RF signal can be input into a mixer that also receives an RF reference signal from a local oscillator. The mixer can down-convert the RF signal to a baseband signal. The up-conversion and/or down-conversion can be performed by a zero-intermediate frequency (IF) architecture, a direct conversion architecture, a low-IF architecture, or the like.

The example RF processor system 104 can include one or more chips, chipsets, or other types of devices that are configured to process RF signals. For example, the RF processor system 104 may include one or more processor devices that are configured to identify and analyze data encoded in RF signals by demodulating and decoding the RF signals transmitted according to various wireless communication standards. In some cases, the RF processor system 104 can include one or more digital signal processor (DSP) devices, forward error correction (FEC) devices, and possibly other types of processor devices.

In some implementations, the RF processor system 104 is configured to monitor and analyze signals that are formatted according to one or more communication standards or protocols, for example, 2G standards such as Global System for Mobile (GSM) and Enhanced Data rates for GSM Evolution (EDGE) or EGPRS; 3G standards such as Code Division Multiple Access (CDMA), Universal Mobile Telecommunications System (UMTS), and Time Division Synchronous Code Division Multiple Access (TD-SCDMA); 4G standards such as Long-Term Evolution (LTE) and LTE-Advanced (LTE-A); wireless local area network (WLAN) or WiFi standards such as IEEE 802.11, Bluetooth, near-field communications (NFC), millimeter communications; or multiple of these or other types of wireless communication standards. In some cases, the RF processor system 104 is capable of extracting all available characteristics, synchronization information, cells and services identifiers, quality measures of RF, physical layers of wireless communication standards and other information. In some implementations, the RF processor system 104 is configured to process other types of wireless communication (e.g., non-standardized signals and communication protocols).

In some implementations, the RF processor system 104 can perform various types of analyses in the frequency domain, the time domain, or both. In some cases, the RF processor system 104 is configured to determine bandwidth, power spectral density, or other frequency attributes of detected signals. In some cases, the RF processor system 104 is configured to perform demodulation and other operations to extract content from the wireless signals in the time domain such as, for example, signaling information included in the wireless signals (e.g., preambles, synchronization information, channel condition indicator, SSID/MAC address of a WiFi network). The RF processor system 104 and the antenna system 102 can operate based on electrical power provided by the power supply 103. For instance, the power supply 103 can include a battery or another type of component that provides an AC or DC electrical voltage to the RF processor system 104.

In some cases, the wireless sensor device 100 is implemented as a compact, portable device that can be used to sense wireless signals and analyze wireless spectrum usage. In some implementations, the wireless sensor device 100 is designed to operate with low power consumption (e.g., around 0.1 to 0.2 Watts or less on average). In some implementations, the wireless sensor device 100 can be smaller than a typical personal computer or laptop computer and can operate in a variety of environments. In some instances, the wireless sensor device 100 can operate in a wireless sensor network or another type of distributed system that analyzes and aggregates wireless spectrum usage over a geographic area. For example, in some implementations, the wireless sensor device 100 can be used as described in U.S. Pat. No. 9,143,168, entitled, "Wireless Spectrum Monitoring and Analysis," or the wireless sensor device 100 can be used in another type of environment or operate in another manner.

Figure 2:
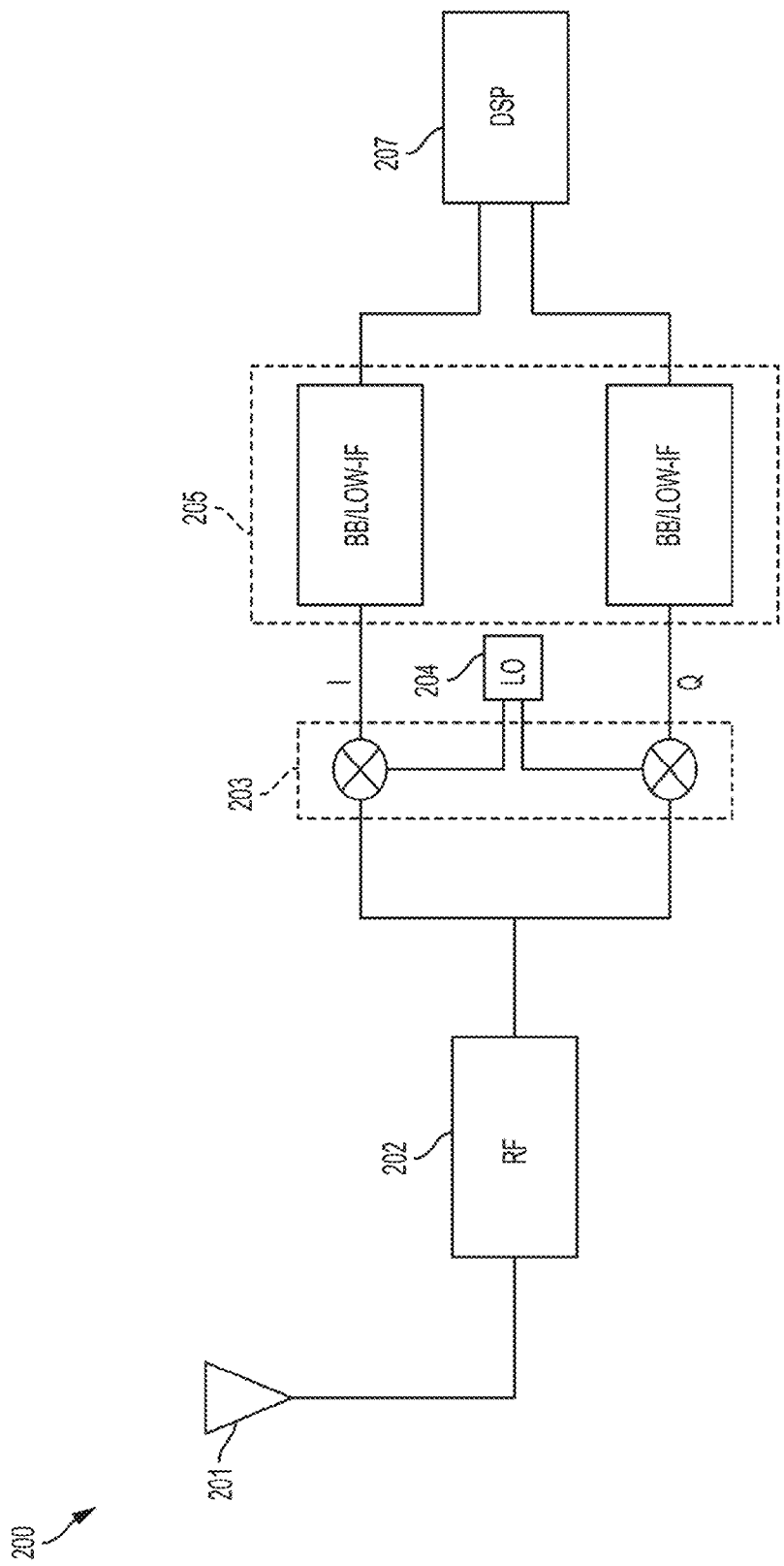
FIG. 2 is a diagram of an example wireless receiver.

FIG. 2 is a diagram of an example wireless receiver 200. The receiver 200 can implement a zero-IF architecture, a direct conversion architecture, a low-IF architecture, or the like. The receiver 200 includes an antenna 201 (e.g., antenna system 102 in FIG. 1) and RF-stage circuitry 202 coupled to the antenna 201. Generally, when items are described as being coupled to one another, they may be communicatively coupled (e.g., directly or indirectly connected for signal communication between them), operatively coupled (e.g., directly or indirectly connected to enable operation of one or both of them) or otherwise. The antenna 201 is configured to receive a wireless signal (e.g., electromagnetic signal) and to then transform the wireless signal to an electronic signal. The electronic signal is transmitted from the antenna 201 to the RF-stage circuitry 202. The RF-stage circuitry 202 can include circuitry, such as, for example, bandpass filter circuitry, amplifier circuitry (e.g., a low noise amplifier (LNA)), etc., that is configured to perform actions on the electronic signal, such as filtering out signals at unwanted frequencies, amplifying the electronic signal, etc. The RF-stage circuitry 202 is configured to output an RF signal.

The receiver 200 further includes a mixer 203 and a local oscillator 204. In some cases, the local oscillator 204 can be implemented according to the example local oscillator 400 shown in FIG. 4 or the example local oscillator shown in FIGS. 7 and 8, or the local oscillator 204 can be implemented in another manner. The local oscillator 204 is coupled to and provides to the mixer 203 an in-phase RF reference signal and a quadrature RF reference signal. The RF-stage circuitry 202 is coupled to the mixer 203 and transmits to the mixer 203 the RF signal. The RF signal output from the RF-stage circuitry 202 is down-converted to an in-phase (I) baseband/low-IF (BB/lIF) signal by the mixer 203 using the in-phase RF reference signal from the local oscillator 204, and further, the RF signal output from the RF-stage circuitry 202 is down-converted to a quadrature (Q) BB/lIF signal by the mixer 203 using the quadrature RF reference signal from the local oscillator 204.

The receiver 200 also includes BB/lIF-stage circuitry 205 and a DSP device 207. The BB/lIF-stage circuitry 205 is coupled to the mixer 203 and receives the in-phase and quadrature BB/lIF signals from the mixer 203. The BB/lIF-stage circuitry 205 can include circuitry, such as, for example, filter circuitry, analog-to-digital converter (ADC) circuitry, etc., that is configured to perform actions on the BB/lIF-stage signals, such as filtering out signals at unwanted frequencies, converting the analog signals to digital signals, etc. The in-phase and quadrature BB/lIF signals are input into the DSP device 207 for further processing as discussed above.

Figure 3:
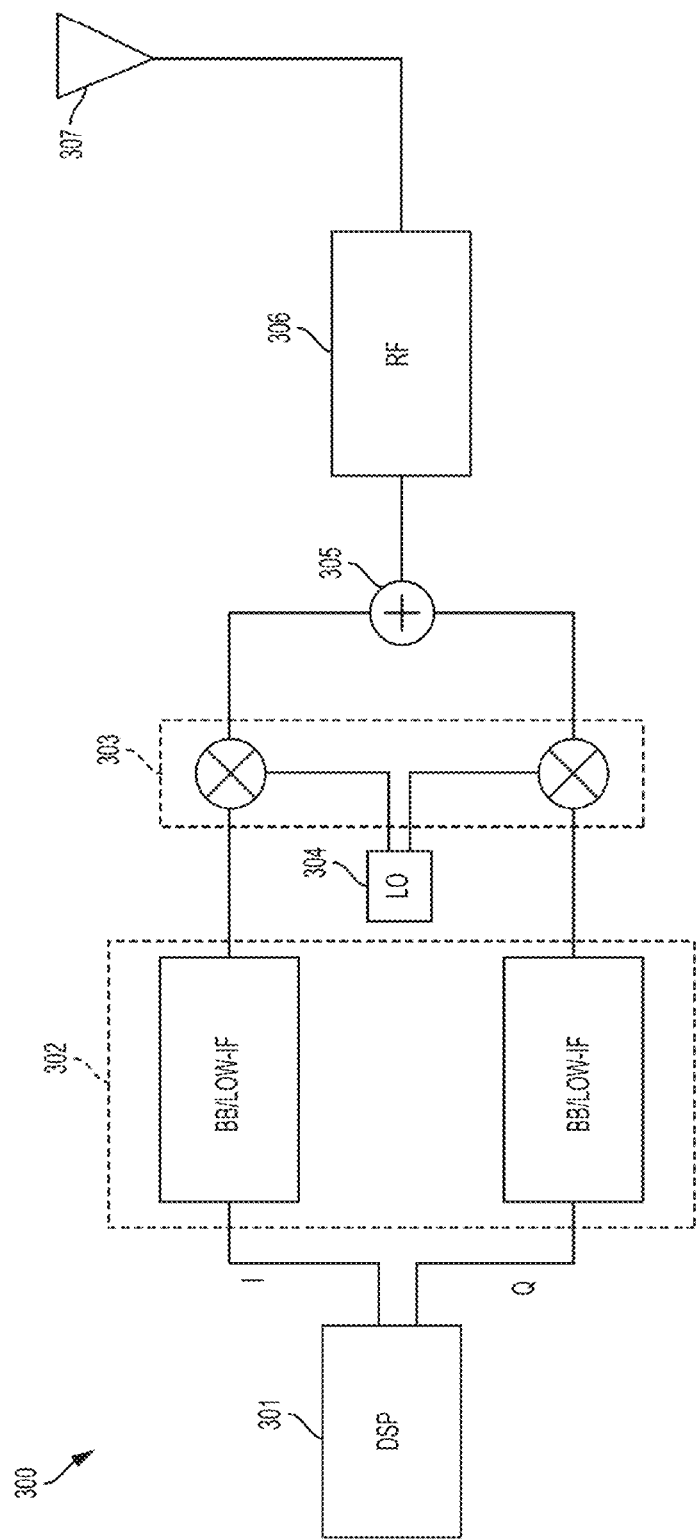
FIG. 3 is a diagram of an example wireless transmitter.

FIG. 3 is a diagram of an example wireless transmitter 300. The transmitter 300 can implement a zero-IF architecture, a direct conversion architecture, a low-IF architecture, or the like. The transmitter 300 includes a DSP device 301 that outputs an in-phase (I) BB/lIF signal and a quadrature (Q) BB/lIF signal. The transmitter 300 also includes BB/lIF-stage circuitry 302 coupled to the DSP device 301 and that receives the in-phase and quadrature BB/IIF signals from the DSP device 301. The BB/IIF-stage circuitry 302 can include circuitry, such as, for example, digital-to-analog converter (DAC) circuitry, filter circuitry, etc., that is configured to perform actions on the BB/IIF signals, such as, for example, converting the digital signals to analog signals, filtering out signals at unwanted frequencies, etc. The BB/IIF-stage circuitry 302 is configured to output in-phase and quadrature BB/IIF signals.

The transmitter 300 further includes a mixer 303 and a local oscillator 304. In some cases, the local oscillator 304 can be implemented according to the example local oscillator 400 shown in FIG. 4 or the example local oscillator shown in FIGS. 7 and 8, or the local oscillator 304 can be implemented in another manner. The local oscillator 304 is coupled to and provides to the mixer 303 an in-phase RF reference signal and a quadrature RF reference signal. The BB/IIF-stage circuitry 302 is coupled to the mixer 303 and transmits to the mixer 303 the in-phase and quadrature BB/IIF signals. The in-phase BB/IIF signal output from the BB/IIF-stage circuitry 302 is up-converted to an in-phase (I) RF signal by the mixer 303 using the in-phase RF reference signal from the local oscillator 304, and further, the quadrature BB/IIF signal output from the BB/IIF-stage circuitry 302 is up-converted to a quadrature (Q) RF signal by the mixer 303 using the quadrature RF reference signal from the local oscillator 304.

The in-phase and quadrature RF signals output by the mixer 303 are combined at 305 to form a combined RF signal, and the combined RF signal is input into RF-stage circuitry 306 of the transmitter 300. The RF-stage circuitry 306 can include circuitry, such as, for example, bandpass filter circuitry, amplifier circuitry (e.g., a power amplifier), etc., that is configured to perform actions on the electronic signal, such as filtering out signals at unwanted frequencies, amplifying the RF signal, etc. The RF-stage circuitry 306 transmits the RF signal to an antenna 307. The antenna 307 is configured to receive the RF signal and to then transform the electronic RF signal to a wireless signal (e.g., electromagnetic signal). The wireless signal is transmitted from the antenna 307.

Figure 4:
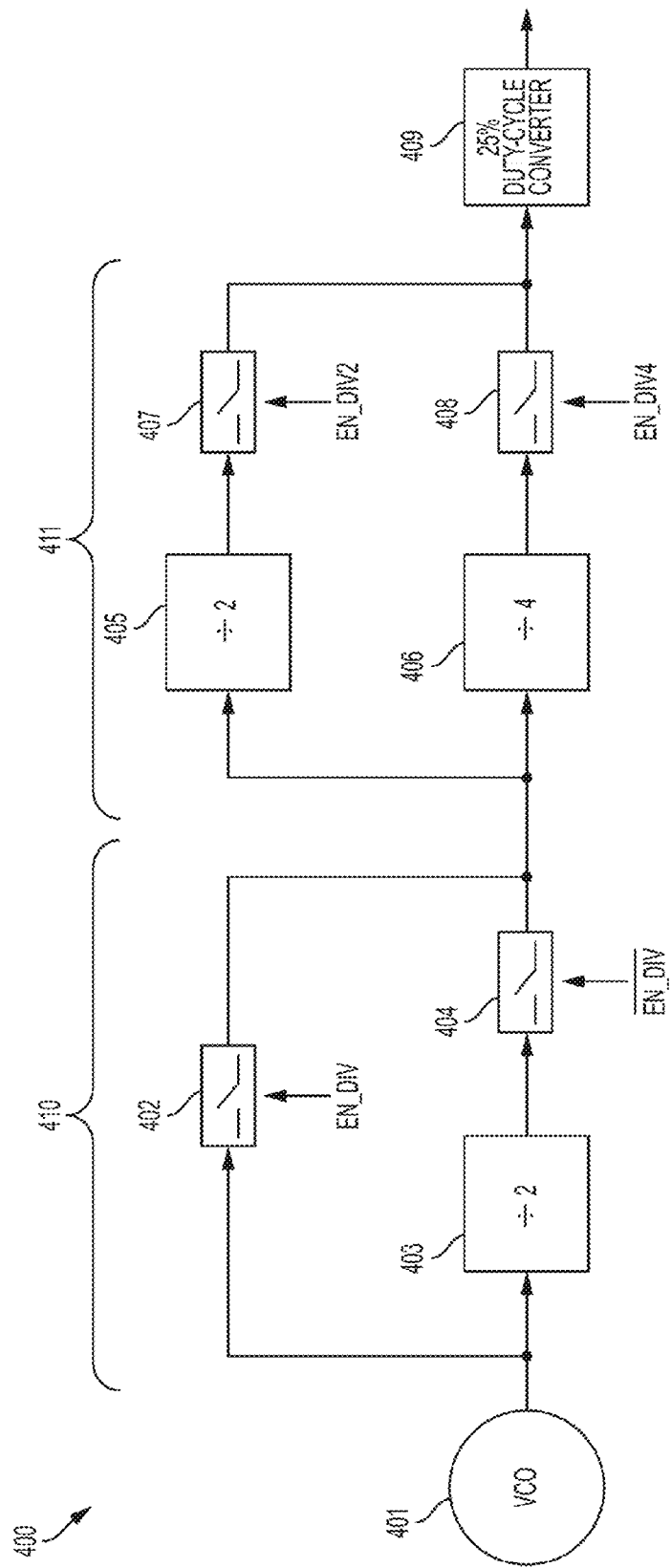
FIG. 4 is a diagram of an example local oscillator.

FIG. 4 is a diagram of an example local oscillator 400. In some cases, the local oscillator 400 can be used in a wireless sensor device (e.g., the wireless sensor device 100 shown in FIG. 1) or another type of wireless system. For example, the local oscillator can be used in a wireless transmitter, a wireless receiver or a wireless transceiver. In some cases, the example local oscillator 400 shown in FIG. 4 can be used to implement the local oscillators 204 and 304 shown in FIGS. 2 and 3, for example.

The example local oscillator 400 shown in FIG. 4 includes a voltage-controlled oscillator (VCO) 401, a multi-stage frequency divider having a first stage 410 and a second stage 411, and a duty-cycle converter 409. A local oscillator may include additional or different features, and the components of a local oscillator can be arranged in the manner shown or in another manner.

In the example local oscillator 400 shown in FIG. 4, the multi-stage frequency divider includes multiple stages of circuitry that process signals in series; each stage of circuitry can, in some instances, divide the frequency of a signal and propagate the frequency-divided signal to a subsequent stage or to another device. The frequency division applied at each stage can be specified by a control signal delivered to the stage, and in some instances, one or more of the stages propagates the input signal to a subsequent stage (or to another device) without dividing the frequency of the signal. In some cases, one or more of the stages is configured to perform additional of different types of processing.

In the example shown in FIG. 4, the first stage 410 of the multi-stage frequency divider includes a first signal path having a first switch 402, and a second signal path having a first frequency divider 403 and a second switch 404. The signal paths in the first stage are configured to produce signals with distinct frequencies. For instance, the second signal path includes the first frequency divider 403 that divides frequencies by two, and the first signal path does not have a frequency divider, so the second signal path produces an output signal with half the frequency of the output signal produced by the first signal path. The second stage 411 of the multi-stage frequency divider includes a third signal path having a second frequency divider 405 and a third switch 407, and a fourth signal path having a third frequency divider 406 and a fourth switch 408. The signal paths in the second stage are configured to produce signals with distinct frequencies. For instance, the third signal path includes the second frequency divider 405 that divides frequencies by two, and the fourth signal path includes the third frequency divider 406 that divides frequencies by four, so the fourth signal path produces an output signal with half the frequency of the output signal produced by the third signal path. The respective stages of a multi-stage frequency divider may include additional or different features, and may be configured as shown or in another manner.

In the example shown in FIG. 4, the first stage 410 is configured to receive (from the VCO 401) a first reference signal having a first radio frequency, and the switches in the first stage 410 are configured to receive control signals. The circuitry in the first stage 410 is configured to generate a second reference signal from the first reference signal, such that the second reference signal has a second radio frequency that is the quotient of the first radio frequency and a first divisor; the first divisor is controlled by the control signals that are received by the switches in the first stage 410. Similarly, the second stage 411 is configured to receive the second reference signal from the first stage, and the switches in the second stage 411 are configured to receive control signals. The circuitry in the second stage 411 is configured to generate a third reference signal from the second reference signal, such that the third reference signal has a third frequency that is the quotient of the second frequency and a second divisor; the second divisor is controlled by the control signals that are received by the switches in the second stage 411. Examples of the first and second divisors are shown in TABLE 1 below.

The example VCO 401 can be, for example, a ring-type oscillator, an LC oscillator, or another type of voltage controlled oscillator. Each of the first switch 402, the second switch 404, the third switch 407, and the fourth switch 408 can be a switch, such as, for example, a single transistor or another type of switch. For instance, a switch may be implemented using a p-type or n-type Field Effect Transistor (FET), such as a p-type or n-type Metal Oxide Semiconductor (MOS) FET, a parallel combination of a p-type or n-type FET as in a transmission gate, or the like. Each of the first frequency divider 403, the second frequency divider 405, and the third frequency divider 406 can be implemented as circuitry that divides the frequency of an input signal by a number, e.g., integer or fractional number, and produces an output signal having the divided frequency. In the example shown, the first frequency divider 403, the second frequency divider 405, and the third frequency divider 406 divide the frequencies of their respective input signals by two, two, and four, respectively. A frequency divider may divide the frequency of a signal by another value in some cases. The duty-cycle converter 409 can convert the duty-cycle of an input signal by a designated amount. In the example shown, the duty-cycle is converted to a twenty-five percent duty-cycle.

In the example shown in FIG. 4, an output node of the VCO 401 is coupled to an input node of the first stage 410 (e.g., to respective input nodes of the first switch 402 and the first frequency divider 403). An output node of the first frequency divider 403 is coupled to an input node of the second switch 404. The first switch 402 is controlled by a first control signal EN_DIV to selectively open or close the first switch 402, and the second switch 404 is controlled by a complementary first control signal EN_DIV to selectively open or close the second switch 404. Accordingly, in this example, the first and second switches 402, 404 are configured such that one switch is open when the other switch is closed (e.g., the first switch 402 is open when the second switch 404 is closed, and the second switch 404 is open when the first switch 402 is closed). Output nodes of the first switch 402 and the second switch 404 are coupled together to form an output node of the first stage 410.

As shown in FIG. 4, the output node of the first stage 410 is coupled to an input node of the second stage 411 (e.g., to input nodes of the second frequency divider 405 and the third frequency divider 406). An output node of the second frequency divider 405 is coupled to an input node of the third switch 407, and an output node of the third frequency divider 406 is coupled to an input node of the fourth switch 408. Output nodes of the third switch 407 and the fourth switch 408 are coupled together to form an output node of the second stage 411. The output node of the second stage 411 is coupled to an input node of the duty-cycle converter 409.

In the example shown in FIG. 4, the third switch 407 is controlled by a second control signal EN_DIV2 to selectively open or close the third switch 407, and the fourth switch 408 is controlled by a third control signal EN_DIV4 to selectively open or close the fourth switch 408. In some examples, the third control signal EN_DIV4 is complementary to the second control signal EN_DIV2. Accordingly, the third and fourth switches 407, 408 can be configured such that one switch is open when the other switch is closed (e.g., the third switch 407 is open when the fourth switch 408 is closed, and the fourth switch 408 is open when the third switch 407 is closed). In some examples, the third switch 407 and the fourth switch 408 are configured to be operated independently, such that either switch can be open or closed independent of the state of the other switch.

In some aspects of operation, the VCO 401 generates an original reference signal having an original frequency. The VCO 401 outputs the original reference signal to the input node of the first stage 410 (e.g., to the input nodes of the first switch 402 and the first frequency divider 403). The first frequency divider 403 then divides the original frequency of the original reference signal and outputs to the input node of the second switch 404 a first-stage-divided reference signal with a first-stage-divided frequency that is the original frequency divided by a number (divided by two, in the example shown). In the example shown, the first control signal EN_DIV and the complementary first control signal EN_DIV selectively close either the first switch 402 or the second switch 404 while the other switch is open. When the first switch 402 is closed and the second switch 404 is open, the original reference signal having the original frequency is output from the first stage 410 as the first stage output signal that is input to the second stage 411 (e.g., to the second frequency divider 405 and the third frequency divider 406). In such an instance, the first stage output signal output from the first stage 410 has the original frequency. When the second switch 404 is closed and the first switch 402 is open, the first-stage-divided signal having the first-stage-divided frequency (in this example, the original frequency divided by two) is output from the first stage 410 as the first stage output signal that is input to the second stage 411 (e.g., to the second frequency divider 405 and the third frequency divider 406).

From the input node of the second stage 411, the second frequency divider 405 then divides the frequency of the first stage output signal (e.g., the original frequency of the original reference signal or the first-stage-divided frequency of the first-stage-divide signal) and outputs to the input node of the third switch 407 a first second-stage-divided reference signal with a first second-stage-divided frequency that is the frequency of the first stage output signal divided by a number (divided by two, in the example shown). Also from the input node of the second stage 411, the third frequency divider 406 then divides the frequency of the first stage output signal (e.g., the original frequency of the original reference signal or the first-stage-divided frequency of the first-stage-divide signal) and outputs to the input node of the fourth switch 408 a second second-stage-divided reference signal with a second second-stage-divided frequency that is the frequency of the first stage output signal divided by a number that is different from the divisor applied by the second frequency divider 405. The second control signal EN_DIV2 and the third control signal EN_DIV4 will can selectively close either the third switch 407 or the fourth switch 408 while the other switch is open. When the third switch 407 is closed and the fourth switch 408 is open, the first second-stage-divided signal having the first second-stage-divided frequency is output from the second stage 411 as the second stage output signal that is input to the duty-cycle converter 409. When the fourth switch 408 is closed and the third switch 407 is open, the second second-stage-divided signal having the second second-stage-divided frequency is output from the second stage 411 as the second stage output signal that is input to the duty-cycle converter 409.

TABLE 1 below shows the frequency $f_f$ of the second stage output signal produced by the second stage 411 and received at the duty-cycle converter 409 under the given conditions. The original reference signal produced by the VCO 401 and input to the first stage 410 has the original frequency $f_o$. The first frequency divider 403 divides the frequency of an input signal by a first divisor $D_1$ (e.g., 2 as illustrated); the second frequency divider 405 divides the frequency of an input signal by a second divisor $D_2$ (e.g., 2 as illustrated); and the third frequency divider 406 divides the frequency of an input signal by a third divisor $D_3$ (e.g., 4 as illustrated).

TABLE 1

| First switch 402 | Second switch 404 | Third switch 407 | Fourth switch 408 | Frequency $f_f$ |
|---|---|---|---|---|
| Closed | Open | Closed | Open | $\frac{f_o}{D_2}$ |
| Closed | Open | Open | Closed | $\frac{f_o}{D_3}$ |

TABLE 1-continued

| First switch 402 | Second switch 404 | Third switch 407 | Fourth switch 408 | Frequency $f_{f}$ |
|---|---|---|---|---|
| Open | Closed | Closed | Open | $\dfrac{f_o}{\overline{D_1 D_2}}$ |
| Open | Closed | Open | Closed | $\dfrac{f_o}{\overline{D_1 D_3}}$ |

In the example shown in FIG. 4, the duty-cycle converter 409 then converts the duty-cycle of the second stage output signal (e.g., the first second-stage-divided signal or the second second-stage-divided signal) to produce a corresponding local oscillator reference signal with a duty-cycle and having a frequency of the second stage output signal. The local oscillator reference signal is output to a mixer.

Figure 5:
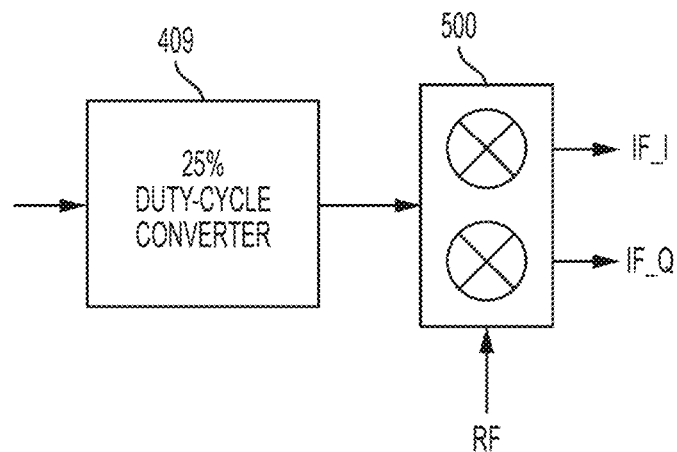
FIG. 5 is a diagram showing a portion of an example receiver circuit that uses the local oscillator 400 of FIG. 4.

FIG. 5 is a diagram showing a portion of an example receiver circuit that can use the local oscillator 400 of FIG. 4. The example receiver circuit shown in FIG. 5 includes a mixer 500. The mixer 500 can include circuitry that down-converts an RF signal to an IF signal (e.g., low IF signal), such as an IF signal having an in-phase (I) signal and a quadrature (Q) signal. An output node of the duty-cycle converter 409 is coupled to an input of the mixer 500. The mixer 500 has an RF input node RF, an IF in-phase output node IF_I, and an IF quadrature output node IF_Q. In some aspects of operation, the local oscillator reference signal is output from the duty-cycle converter 409 and input into the mixer 500. The mixer 500 receives an RF signal (e.g., from an antenna through RF-stage circuitry) on the RF input node RF. The mixer 500 then uses the local oscillator reference signal to down-convert the RF signal to an IF in-phase signal and an IF quadrature signal that are output on the IF in-phase output node IF_I and the IF quadrature output node IF_Q, respectively (e.g., to BB/lIF-stage circuitry). In some instances, a baseband (BB) signal can be processed in a similar manner as the IF signal discussed above.

Figure 6:
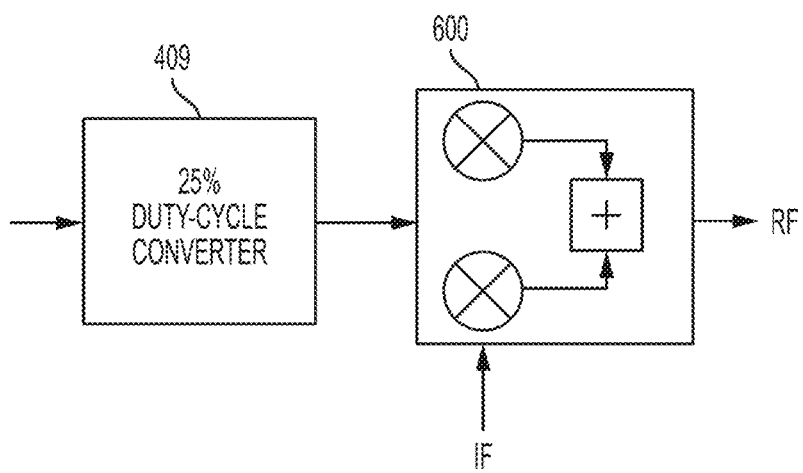
FIG. 6 is a diagram showing a portion of an example transmitter circuit that uses the local oscillator 400 of FIG. 4.

FIG. 6 is a diagram showing a portion of an example transmitter circuit that can use the local oscillator 400 of FIG. 4. The example transmitter circuit shown in FIG. 6 includes a mixer 600. The mixer 600 can include circuitry that up-converts an IF signal to an RF signal. An output node of the duty-cycle converter 409 (see FIG. 4) is coupled to an input of the mixer 600. The mixer 600 has an IF input node IF and an RF output node RF. In some aspects of operation, the local oscillator reference signal is output from the duty-cycle converter 409 and input into the mixer 600. The mixer 600 receives an IF signal (e.g., from BB/lIF-stage circuitry) on the IF input node IF. The mixer 600 then uses the local oscillator reference signal to up-convert the IF signal to an RF signal that is output on the RF output node RF (e.g., to an antenna through RF-stage circuitry). In some instances, a baseband (BB) signal can be processed in a similar manner as the IF signal discussed above.

Figure 7:
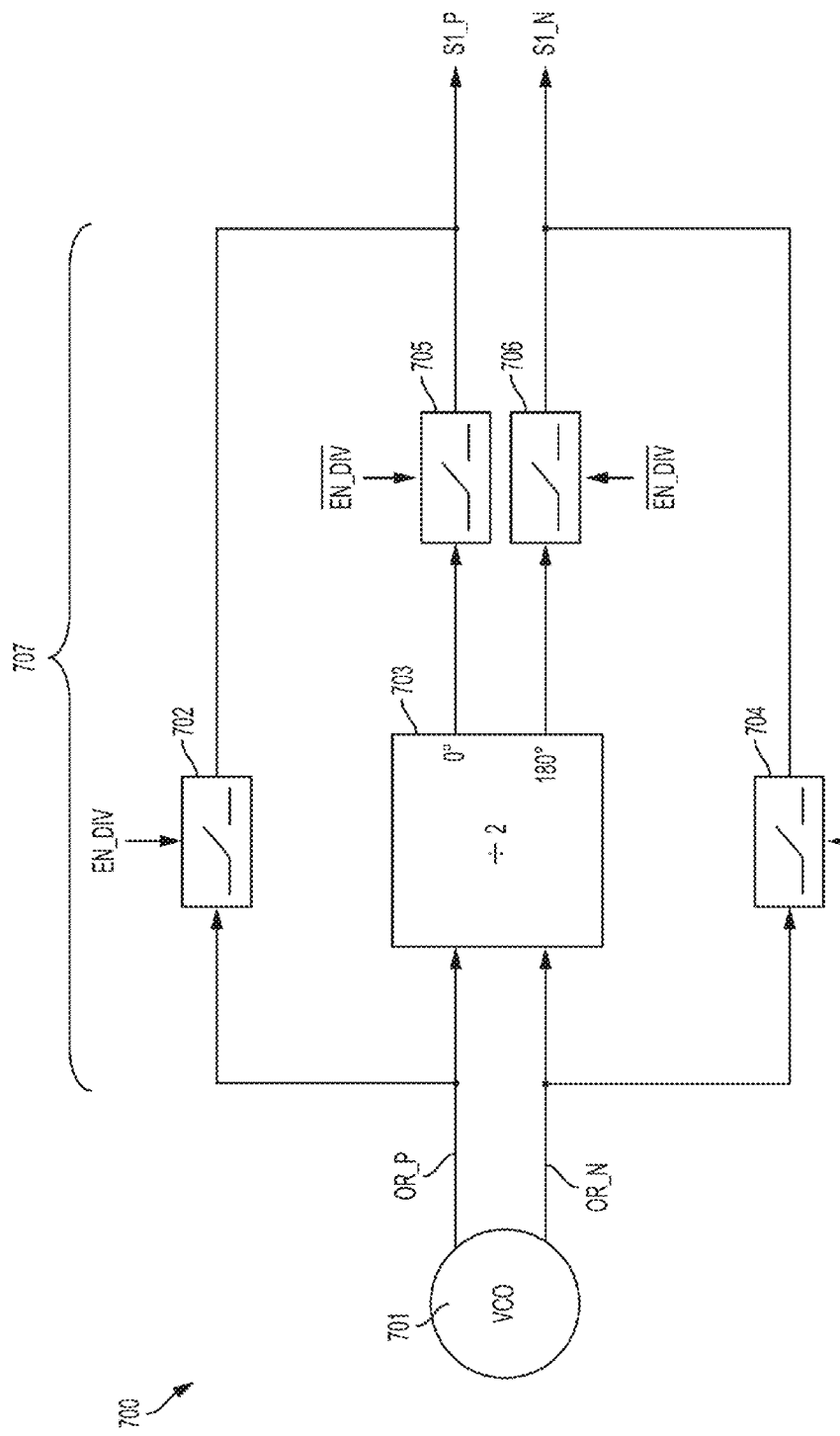
FIG. 7 is a diagram showing an example circuit implementation of a voltage controlled oscillator (VCO) and first stage of a multi-stage frequency divider of a local oscillator.
Figure 8:
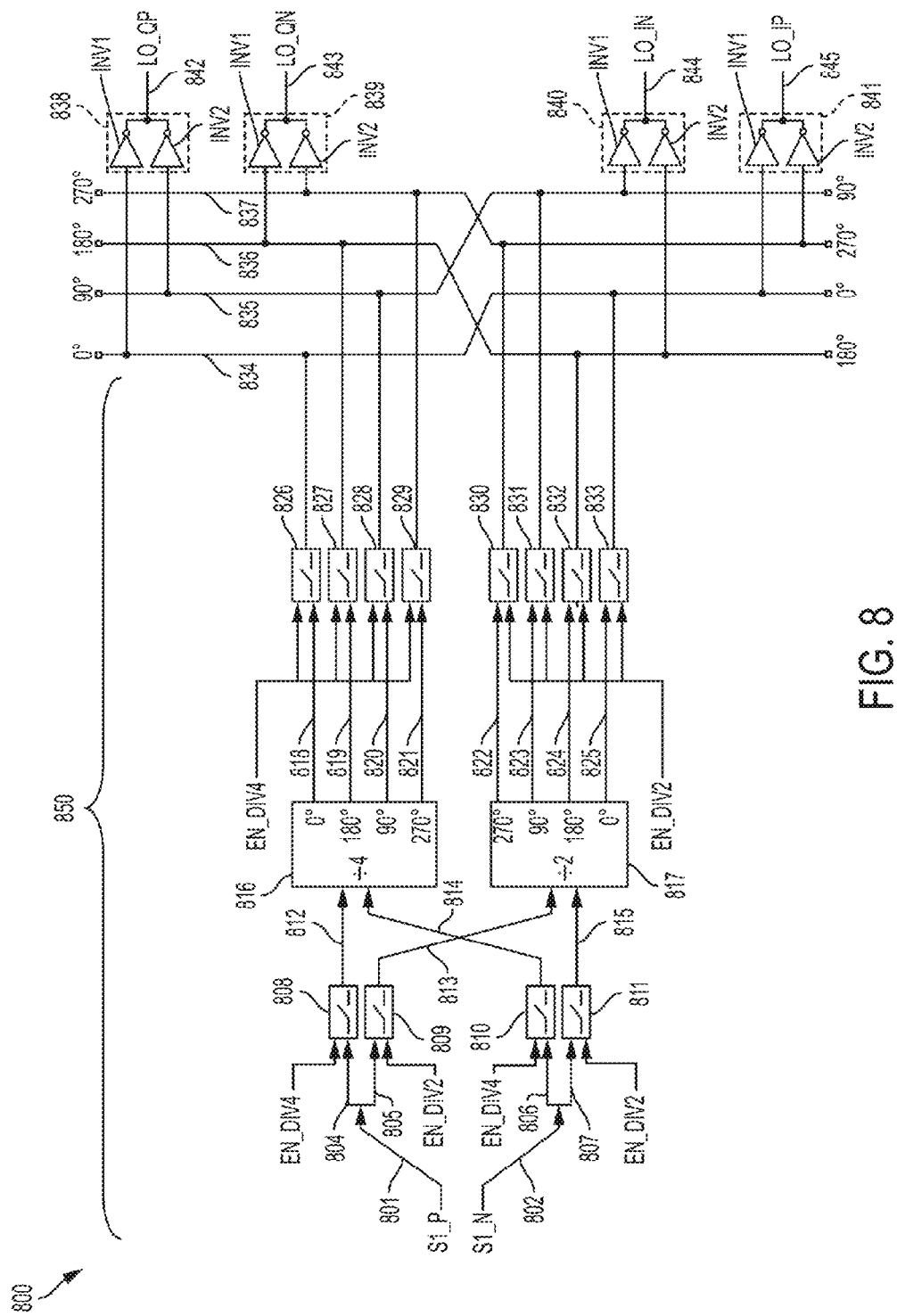
FIG. 8 is a diagram showing an example circuit implementation of a second stage of the multi-stage frequency divider in FIG. 7 and duty-cycle converters of the local oscillator.

FIGS. 7 and 8 show aspects of another example local oscillator. In some cases, the local oscillator shown in FIGS. 7 and 8 can be used in a wireless sensor device (e.g., the wireless sensor device 100 shown in FIG. 1) or another type of wireless system. For example, the local oscillator can be used in a wireless transmitter, a wireless receiver or a wireless transceiver. In some cases, the example local oscillator shown in FIGS. 7 and 8 can be used to implement the local oscillators 204 and 304 shown in FIGS. 2 and 3, for example. In some aspects, the local oscillator shown in FIGS. 7 and 8 can be considered an example implementation of the local oscillator 400 shown in FIG. 4. A local oscillator may include additional or different features, and the components of a local oscillator can be arranged in the manner shown in FIGS. 7 and 8 or in another manner.

The example local oscillator shown in FIGS. 7 and 8 includes a multi-stage frequency divider, which includes multiple stages of circuitry that process signals in series. In particular, a first stage 707 is shown in FIG. 7 and a second stage 850 is shown in FIG. 8. Additional or different stages may be used. Each stage of the multi-stage frequency divider can, in some instances, divide the frequency of a signal and propagate the frequency-divided signal to a subsequent stage or another device. The frequency division applied at each stage can be specified by a control signal delivered to the stage, and in some instances, one or more of the stages propagates the input signal to a subsequent stage or another device without dividing the frequency of the signal. A multi-stage frequency divider may be configured as shown in FIGS. 7 and 8 or in another manner.

In the example shown in FIGS. 7 and 8, the first stage 707 of the multi-stage frequency divider includes a first signal path having first and second switches 702, 704, and a second signal path having a first frequency divider 703 and third and fourth switches 705, 706. The second stage 850 of the multi-stage frequency divider includes a third signal path having a second frequency divider 816 and multiple switches (808, 810, 826, 827, 828, 829), and a fourth signal path having a third frequency divider 817 and multiple switches (809, 811, 830, 831, 832, 833). The respective stages of a multi-stage frequency divider may include additional or different features, and may be configured as shown or in another manner.

In the example shown in FIGS. 7 and 8, the first stage 707 is configured to receive (from the VCO 701) a differential first reference signal having a first radio frequency, and the switches in the first stage 707 are configured to receive control signals. The circuitry in the first stage 707 is configured to generate a differential second reference signal from the differential first reference signal, such that the differential second reference signal has a second radio frequency that is the quotient of the first radio frequency and a first divisor; the first divisor is controlled by the control signals that are received by the switches in the first stage 707. Similarly, the second stage 850 is configured to receive the differential second reference signal from the first stage 707, and the switches in the second stage 850 are configured to receive control signals. The circuitry in the second stage 850 is configured to generate a differential third reference signal from the differential second reference signal, such that the differential third reference signal has a third frequency that is the quotient of the second frequency and a second divisor; the second divisor is controlled by the control signals that are received by the switches in the second stage 850.

FIG. 7 is a diagram showing an example circuit implementation of a voltage controlled oscillator (VCO) 701 and first stage of a multi-stage frequency divider of a local oscillator. The example circuit 700 shown in FIG. 7 utilizes differential signals and appropriate connections to transmit differential signals. The differential signal includes two signals that are 180° out of phase with each other, or are complementary of each other. Here, a positive signal component (with a 0° phase shift) of a differential signal (and nodes on which the positive signal is carried) is designated with a "P," and a negative signal component (with a 180° phase shift) of a differential signal (and nodes on which the negative signal is carried) is designated with a "N."

The example VCO 701 has a first output node OR_P and a second output node OR_N. The first output node OR_P of the VCO 701 is coupled to a first input node of the first stage 707 (e.g., to respective input nodes of a first switch 702 and the first frequency divider 703). The second output node OR_N of the VCO 701 is coupled to a second input node of the first stage 707 (e.g., to respective input nodes of a second switch 704 and the first frequency divider 703). A first output node of the first frequency divider 703 is coupled to an input node of the third switch 705. A second output node of the first frequency divider 703 is coupled to an input node of the fourth switch 706. Output nodes of the first switch 702 and the third switch 705 are coupled together and form a first output node S1_P of the first stage 707. Output nodes of the second switch 704 and the fourth switch 706 are coupled together and form a second output node S1_N of the first stage 707. The first switch 702 and the second switch are controlled by a first control signal EN_DIV to selectively open and close the first switch 702 and the second switch 704; the third switch 705 and the fourth switch 706 are controlled by a complementary first control signal $\overline{\text{EN\_DIV}}$ to selectively open and close the third switch 705 and the fourth switch 706. Accordingly, the first switch 702 and the second switch 704 are open when the third switch 705 and the fourth switch 706 are closed, and vice versa.

FIG. 8 is a diagram showing an example circuit implementation of a second stage 850 of the multi-stage frequency divider in FIG. 7 and duty-cycle converters 838, 839, 840, and 841 of the local oscillator. The example circuit 800 utilizes differential signals, and hence, appropriate connections to transmit differential signals.

As shown in FIG. 8, the first output node S1_P of the first stage 707 (shown in FIG. 7) is coupled a first input node 801 of the second stage 850, and the second output node S1_N of the first stage 707 (shown in FIG. 7) is coupled to a second input node 802 of the second stage 850. The first input node 801 of the second stage 850 is coupled to an input node 804 of a first switch 808 and an input node 805 of a second switch 809. The second input node 802 of the second stage 850 is coupled to an input node 806 of a third switch 810 and an input node 807 of a fourth switch 811. An output node of the first switch 808 is coupled to a first input node 812 of a second frequency divider 816, and an output node of the third switch 810 is coupled to a second input node 814 of the second frequency divider 816. An output node of the second switch 809 is coupled to a first input node 813 of a third frequency divider 817, and an output node of the fourth switch 811 is coupled to a second input node 815 of the third frequency divider 817.

As shown in FIG. 8, each of the second frequency divider 816 and the third frequency divider 817 include four output nodes. The four output nodes include an in-phase output node having an in-phase signal designated by "0°", and three output nodes having respective signals with phase differences from the in-phase output node as designated by "90°," "180°," and "270°." A first output node 818 of the second frequency divider 816 (e.g., that outputs an in-phase signal) is coupled to an input node of a fifth switch 826. A second output node 819 of the second frequency divider 816 (e.g., that outputs a signal 180° out of phase from the in-phase signal) is coupled to an input node of a sixth switch 827. A third output node 820 of the second frequency divider 816 (e.g., that outputs a signal 90° out of phase from the in-phase signal) is coupled to an input node of a seventh switch 828. A fourth output node 821 of the second frequency divider 816 (e.g., that outputs a signal 270° out of phase from the in-phase signal) is coupled to an input node of an eighth switch 829.

As shown in FIG. 8, a first output node 825 of the third frequency divider 817 (e.g., that outputs an in-phase signal) is coupled to an input node of a ninth switch 833. A second output node 824 of the third frequency divider 817 (e.g., that outputs a signal 180° out of phase from the in-phase signal) is coupled to an input node of a tenth switch 832. A third output node 823 of the third frequency divider 817 (e.g., that outputs a signal 90° out of phase from the in-phase signal) is coupled to an input node of an eleventh switch 831. A fourth output node 822 of the third frequency divider 817 (e.g., that outputs a signal 270° out of phase from the in-phase signal) is coupled to an input node of a twelfth switch 830.

As shown in FIG. 8, output nodes of the fifth switch 826, sixth switch 827, seventh switch 828, eighth switch 829, ninth switch 833, tenth switch 832, eleventh switch 831, and twelfth switch 830 are coupled to a respective one of a first bus line 834, second bus line 835, third bus line 836, or fourth bus line 837 of a bus. The output nodes of the fifth switch 826 and the ninth switch 833 are coupled to the first bus line 834 (e.g., that carries an in-phase signal). The output nodes of the sixth switch 827 and the tenth switch 832 are coupled to the third bus line 836 (e.g., that carries a signal 180° out of phase from the in-phase signal). The output nodes of the seventh switch 828 and the eleventh switch 831 are coupled to the second bus line 835 (e.g., that carries a signal 90° out of phase from the in-phase signal). The output nodes of the eighth switch 829 and the twelfth switch 830 are coupled to the fourth bus line 837 (e.g., that carries a signal 270° out of phase from the in-phase signal).

In the example shown in FIG. 8, the second switch 809, fourth switch 811, ninth switch 833, tenth switch 832, eleventh switch 831, and twelfth switch 830 are controlled by a second control signal EN_DIV2 to selectively open and close the second switch 809, fourth switch 811, ninth switch 833, tenth switch 832, eleventh switch 831, and twelfth switch 830. The first switch 808, third switch 810, fifth switch 826, sixth switch 827, seventh switch 828, and eighth switch 829 are controlled by a third control signal EN_DIV4 to selectively open and close the first switch 808, third switch 810, fifth switch 826, sixth switch 827, seventh switch 828, and eighth switch 829. The third control signal EN_DIV4 may be complementary to the second control signal EN_DIV2, and accordingly, the second switch 809, fourth switch 811, ninth switch 833, tenth switch 832, eleventh switch 831, and twelfth switch 830 may be open when the first switch 808, third switch 810, fifth switch 826, sixth switch 827, seventh switch 828, and eighth switch 829 are closed, and vice versa. In some instances, the first switch 808, second switch 809, third switch 810, fourth switch 811, fifth switch 826, sixth switch 827, seventh switch 828, eighth switch 829, ninth switch 833, tenth switch 832, eleventh switch 831, and twelfth switch 830 may be open simultaneously.

As shown in FIG. 8, duty-cycle converters are coupled to the bus. Each of a first duty-cycle converter 838, a second duty-cycle converter 839, a third duty-cycle converter 840, and a fourth duty-cycle converter 841 includes a first inverter INV1 and a second inverter INV2. A first input node of the first duty-cycle converter 838 (e.g., an input node of the first inverter INV1) is coupled to the first bus line 834, and a second input node of the first duty-cycle converter 838 (e.g., an input node of the second inverter INV2) is coupled to the second bus line 835. Output nodes of the first inverter INV1 and the second inverter INV2 of the first duty-cycle converter 838 are coupled together to form a positive quadrature local oscillator reference signal output node (LO_QP) 842 of the first duty-cycle converter 838. A first input node of the second duty-cycle converter 839 (e.g., an input node of the first inverter INV1) is coupled to the third bus line 836, and a second input node of the second duty-cycle converter 839 (e.g., an input node of the second inverter INV2) is coupled to the fourth bus line 837. Output nodes of the first inverter INV1 and the second inverter INV2 of the second duty-cycle converter 839 are coupled together to form a negative quadrature local oscillator reference signal output node (LO_QN) 843 of the second duty-cycle converter 839. A first input node of the third duty-cycle converter 840 (e.g., an input node of the first inverter INV1) is coupled to the second bus line 835, and a second input node of the third duty-cycle converter 840 (e.g., an input node of the second inverter INV2) is coupled to the third bus line 836. Output nodes of the first inverter INV1 and the second inverter INV2 of the third duty-cycle converter 840 are coupled together to form a negative in-phase local oscillator reference signal output node (LO_IN) 844 of the third duty-cycle converter 840. A first input node of the fourth duty-cycle converter 841 (e.g., an input node of the first inverter INV1) is coupled to the first bus line 834, and a second input node of the fourth duty-cycle converter 841 (e.g., an input node of the second inverter INV2) is coupled to the fourth bus line 837. Output nodes of the first inverter INV1 and the second inverter INV2 of the fourth duty-cycle converter 841 are coupled together to form a positive in-phase local oscillator reference signal output node (LO_IP) 845 of the fourth duty-cycle converter 841.

The example VCO 701 can be, for example, a ring-type oscillator, an LC oscillator, or another type of voltage controlled oscillator. Each of the switches in FIGS. 7 and 8 (702, 704, 705, 706, 808, 809, 810, 811, 826, 827, 828, 829, 830, 831, 832 and 833) can be a switch, such as, for example, a single transistor or another type of switch. Each of the first frequency divider 703, the second frequency divider 816, and the third frequency divider 817 can be implemented as circuitry that divides the frequency of an input signal by a number, e.g., integer or fractional number, and produces an output signal having the divided frequency. In the example shown, the first frequency divider 703, the second frequency divider 816, and the third frequency divider 817 divide the frequencies of their respective input signals by two, four, and two, respectively. A frequency divider may divide the frequency of a signal by another value in some cases. Each of the example duty-cycle converters (838, 839, 840, 841) can convert the duty-cycle of an input signal by a designated amount. In the example shown, the duty-cycle is converted to a twenty-five percent duty-cycle.

In the example circuits shown in FIGS. 7 and 8, various lines (e.g., metal lines) in the example circuits 700 and 800 may be matched and have low resistances and capacitances. Low resistance and capacitance may lead to lower RC time constants. Lines that are matched may be symmetric, may have a same length, may have same metal layers, and may observe similar environments (e.g., adjacent surroundings, metal, p+ diffusion, n+ diffusion, poly-silicon fills, and parasitic capacitances). As examples, the following lines may be matched: lines between the output nodes S1_P and S1_N of the first stage 707 and the input nodes 804, 805, 806, 807 of the first through fourth switches 808, 809, 810, 811; lines between output nodes of switches 809, 810 and input nodes 813, 814 of the third frequency divider 817 and the second frequency divider 816; lines between output nodes of switches 808, 809 and input nodes 812, 813 of the second frequency divider 816 and the third frequency divider 817; lines between output nodes of switches 810, 811 and input nodes 814, 815 of the second frequency divider 816 and the third frequency divider 817; lines between output nodes 818, 819, 820, 821 of the second frequency divider 816 and input nodes of the switches 826, 827, 828, 829; lines between output nodes 822, 823, 824, 825 of the third frequency divider 817 and input nodes of the switches 830, 831, 832, 833; and the bus lines 834, 835, 836, 837. In some cases, the arrangement of bus lines 834, 835, 836, 837 may allow an amount of parasitic capacitance seen by each signal on each bus line to be balanced, which may help avoid DC offsets being observed after an up-conversion or down-conversion by a mixer.

In some aspects of the operation, the VCO 701 generates a differential original reference signal having an original frequency. The VCO 701 outputs the differential original reference signal on its first output node OR_P and second output node OR_N and to the input nodes of the first stage 707 (e.g., to the input nodes of the first switch 702, the second switch 704, and the first frequency divider 703). The first frequency divider 703 then divides the original frequency of the differential original reference signal and outputs to the input nodes of the third switch 705 and the fourth switch 706 a differential first-stage-divided reference signal with a first-stage-divided frequency that is the original frequency divided by a number. The first control signal EN_DIV and the complementary first control signal $\overline{EN\_DIV}$ can selectively close either the first switch 702 and the second switch 704 or the third switch 705 and the fourth switch 706 while the other group of switches are open. When the first switch 702 and the second switch 704 are closed and the third switch 705 and the fourth switch 706 are open, the differential original reference signal having the original frequency is output from the first stage 707 as a differential first stage output signal on the first and second output nodes S1_P and S1_N and input to the second stage 850 (e.g., to the first input node 801 and the second input node 802 of the second stage 850). In such an instance, the first stage output signal output from the first stage 707 has the original frequency. When the third switch 705 and the fourth switch 706 are closed and the first switch 702 and the second switch 704 are open, the differential first-stage-divided signal having the first-stage-divided frequency is output from the first stage 707 as the differential first stage output signal on the first and second output nodes S1_P and S1_N and input to the second stage 850 (e.g., to the first input node 801 and the second input node 802 of the second stage 850).

In some aspects of the operation, at the second stage 850, the differential first stage output signal is input to the first input node 801 and the second input node 802 of the second stage 850 from the first output node S1_P and the second output node S1_N, respectively, of the first stage 707. The positive portion of the differential first stage output signal is input along the first input node 801 and into the input nodes 804 and 805 of the first switch 808 and the second switch 809. The negative portion of the differential first stage output signal is input along the second input node 802 and into the input nodes 806 and 807 of the third switch 810 and the fourth switch 811. Switches are selectively open or closed to direct the differential first stage output signal to the second frequency divider 816 or the third frequency divider 817 and to output a second stage output signal to the bus.

In a first scenario, the third control signal EN_DIV4 is in a state (e.g., low or high) such that the first switch 808, third switch 810, fifth switch 826, sixth switch 827, seventh switch 828, and eighth switch 829 are closed while the second control signal EN_DIV2 is in a state (e.g., low or high) such that the second switch 809, fourth switch 811, ninth switch 833, tenth switch 832, eleventh switch 831, and twelfth switch 830 are open. Since the second switch 809 and the fourth switch 811 are open, the differential first stage output signal does not propagate beyond the second switch 809 and the fourth switch 811. Since the first switch 808 and the third switch 810 are closed, the differential first stage output signal is input to the first input node 812 and the second input node 814 of the second frequency divider 816.

The second frequency divider 816 divides the frequency of the differential first stage output signal and outputs to the bus, as a second stage output signal, a first second-stage-divided reference signal with a first second-stage-divided frequency that is the frequency of the differential first stage output signal divided by a number. The second frequency divider 816 outputs an in-phase (e.g., 0° phase difference) first second-stage-divided reference signal on the first output node 818 of the second frequency divider 816, a quadrature (e.g., 90° phase difference from the in-phase signal) first second-stage-divided reference signal on the third output node 820 of the second frequency divider 816, a complementary in-phase (e.g., 180° phase difference) first second-stage-divided reference signal on the second output node 819 of the second frequency divider 816, and a complementary quadrature (e.g., 270° phase difference) first second-stage-divided reference signal on the fourth output node 821 of the second frequency divider 816. Since the fifth switch 826, sixth switch 827, seventh switch 828, and eighth switch 829 are closed, the in-phase first second-stage-divided reference signal from the second frequency divider 816 is output to the first bus line 834; the quadrature first second-stage-divided reference signal from the second frequency divider 816 is output to the second bus line 835; the complementary in-phase first second-stage-divided reference signal from the second frequency divider 816 is output to the third bus line 836; and the complementary quadrature first second-stage-divided reference signal from the second frequency divider 816 is output to the fourth bus line 837.

In a second scenario, the second control signal EN_DIV2 is in a state (e.g., low or high) such that the second switch 809, fourth switch 811, ninth switch 833, tenth switch 832, eleventh switch 831, and twelfth switch 830 are closed while the third control signal EN_DIV4 is in a state (e.g., low or high) such that the first switch 808, third switch 810, fifth switch 826, sixth switch 827, seventh switch 828, and eighth switch 829 are open. Since the first switch 808 and the third switch 810 are open, the differential first stage output signal does not propagate beyond the first switch 808 and the third switch 810. Since the second switch 809 and the fourth switch 811 are closed, the differential first stage output signal is input to the first input node 813 and the second input node 815 of the third frequency divider 817.

The third frequency divider 817 divides the frequency of the differential first stage output signal and outputs to the bus, as a second stage output signal, a second second-stage-divided reference signal with a second second-stage-divided frequency that is the frequency of the differential first stage output signal divided by a number. The third frequency divider 817 outputs an in-phase (e.g., 0° phase difference) second second-stage-divided reference signal on the first output node 825 of the third frequency divider 817, a quadrature (e.g., 90° phase difference from the in-phase signal) second second-stage-divided reference signal on the third output node 823 of the third frequency divider 817, a complementary in-phase (e.g., 180° phase difference) second second-stage-divided reference signal on the second output node 824 of the third frequency divider 817, and a complementary quadrature (e.g., 270° phase difference) second second-stage-divided reference signal on the fourth output node 822 of the third frequency divider 817. Since the ninth switch 833, tenth switch 832, eleventh switch 831, and twelfth switch 830 are closed, the in-phase second second-stage-divided reference signal from the third frequency divider 817 is output to the first bus line 834; the quadrature second second-stage-divided reference signal from the third frequency divider 817 is output to the second bus line 835; the complementary in-phase second second-stage-divided reference signal from the third frequency divider 817 is output to the third bus line 836; and the complementary quadrature second second-stage-divided reference signal from the third frequency divider 817 is output to the fourth bus line 837.

In the first scenario and the second scenario described above, the second stage output signal from either the second frequency divider 816 or the third frequency divider 817 is an example of a differential divided reference signal that can be produced by the multi-stage frequency divider. The example duty-cycle converters shown in FIG. 8 are configured to receive the differential divided reference signal and output a differential duty-cycle converted signal, for instance, as described below.

In some aspects of operation, the in-phase second stage output signal (e.g., the first or second second-stage-divided reference signal) and the complementary quadrature second stage output signal are input to the input node of the first inverter INV1 and the input node of the second inverter INV2, respectively, of the fourth duty-cycle converter 841. The fourth duty-cycle converter 841 outputs a positive in-phase local oscillator reference signal on the positive in-phase local oscillator reference signal output node (LO_IP) 845 of the fourth duty-cycle converter 841. The quadrature second stage output signal and the complementary in-phase second stage output signal are input to the input node of the first inverter INV1 and the input node of the second inverter INV2, respectively, of the third duty-cycle converter 840. The third duty-cycle converter 840 outputs a negative in-phase local oscillator reference signal on the negative in-phase local oscillator reference signal output node (LO_IN) 844 of the third duty-cycle converter 840. The in-phase second stage output signal and the quadrature second stage output signal are input to the input node of the first inverter INV1 and the input node of the second inverter INV2, respectively, of the first duty-cycle converter 838. The first duty-cycle converter 838 outputs a positive quadrature local oscillator reference signal on the positive quadrature local oscillator reference signal output node (LO_QP) 842 of the first duty-cycle converter 838. The complementary in-phase second stage output signal and the complementary quadrature second stage output signal are input to the input node of the first inverter INV1 and the input node of the second inverter INV2, respectively, of the second duty-cycle converter 839. The second duty-cycle converter 839 outputs a negative quadrature local oscillator reference signal on the negative quadrature local oscillator reference signal output node (LO_QN) 843 of the second duty-cycle converter 839. The conversion of the respective duty-cycles by the first duty-cycle converter 838, second duty-cycle converter 839, third duty-cycle converter 840, and fourth duty-cycle converter 841 can be performed, for example, as described with respect to FIGS. 12 and 13 or in another manner. In some examples, the positive in-phase, negative in-phase, positive quadrature, and negative quadrature local oscillator reference signals are output to mixers.

Figure 9:
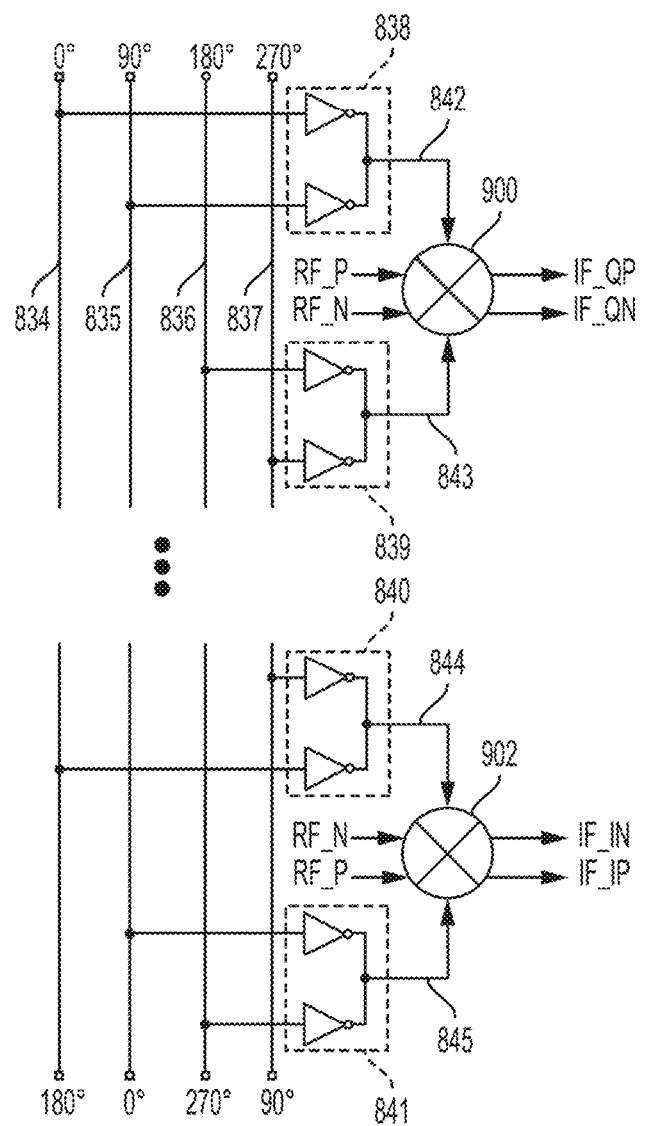
FIG. 9 is a diagram showing a portion of an example receiver circuit that uses the local oscillator shown in FIGS. 7 and 8.

FIG. 9 is a diagram showing a portion of an example receiver circuit that uses the local oscillator shown in FIGS. 7 and 8. In the example shown in FIG. 9, a first mixer 900 has a positive RF input node RF_P and a negative RF input node RF_N (e.g., that may be coupled through RF-stage circuitry to an antenna) and has a positive IF quadrature output node IF_QP and a negative IF quadrature output node IF_QN (e.g., that may be coupled to BB/IIF-stage circuitry). The first mixer 900 further has a first reference signal input node that is coupled to the positive quadrature local oscillator reference signal output node (LO_QP) 842 and a second reference signal input node that is coupled to the negative quadrature local oscillator reference signal output node (LO_QN) 843. A second mixer 902 has a positive RF input node RF_P and a negative RF input node RF_N (e.g., that may be coupled through RF-stage circuitry to an antenna) and has a positive IF in-phase output node IF_IP and a negative IF in-phase output node IF_IN (e.g., that may be coupled to IF-stage circuitry). The second mixer 902 further has a first reference signal input node that is coupled to the positive in-phase local oscillator reference signal output node (LO_IP) 845 and a second reference signal input node that is coupled to the negative in-phase local oscillator reference signal output node (LO_IN) 844.

As further examples, the following lines may be matched: lines between the output nodes 842, 843 of the first duty-cycle converter 838 and the second duty-cycle converter 839 and the input nodes of the first mixer 900; lines between the output nodes 844, 845 of the third duty-cycle converter 840 and the fourth duty-cycle converter 841 and the input nodes of the second mixer 902; lines to input nodes RF_P and RF_N of the first mixer 900 and the second mixer 902; and lines from the output nodes IF_IP, IF_IN, IF_QP, and IF_QN of the first mixer 900 and the second mixer 902.

In some aspects of operation, the differential quadrature local oscillator reference signal is output from the first duty-cycle converter 838 and the second duty-cycle converter 839 on the positive quadrature local oscillator reference signal output node (LO_QP) 842 and the negative quadrature local oscillator reference signal output node (LO_QN) 843, respectively, and input into the first mixer 900. The first mixer 900 receives a differential RF signal on the positive RF input node RF_P and the negative RF input node RF_N. The first mixer 900 then uses the differential quadrature local oscillator reference signal to down-convert the differential RF signal to a differential IF quadrature signal that is output on the positive IF quadrature output node IF_QP and the negative IF quadrature output node IF_QN. In some aspects of operation, the differential in-phase local oscillator reference signal is output from the fourth duty-cycle converter 841 and the third duty-cycle converter 840 on the positive in-phase local oscillator reference signal output node (LO_IP) 845 and the negative in-phase local oscillator reference signal output node (LO_IN) 844, respectively, and input into the second mixer 902. The second mixer 902 receives a differential RF signal on the positive RF input node RF_P and the negative RF input node RF_N. The second mixer 902 then uses the differential in-phase local oscillator reference signal to down-convert the differential RF signal to a differential IF in-phase signal that is output on the positive IF in-phase output node IF_IP and the negative IF in-phase output node IF_IN. In some instances, a baseband (BB) signal can be processed in a similar manner as the IF signal discussed above.

Figure 10:
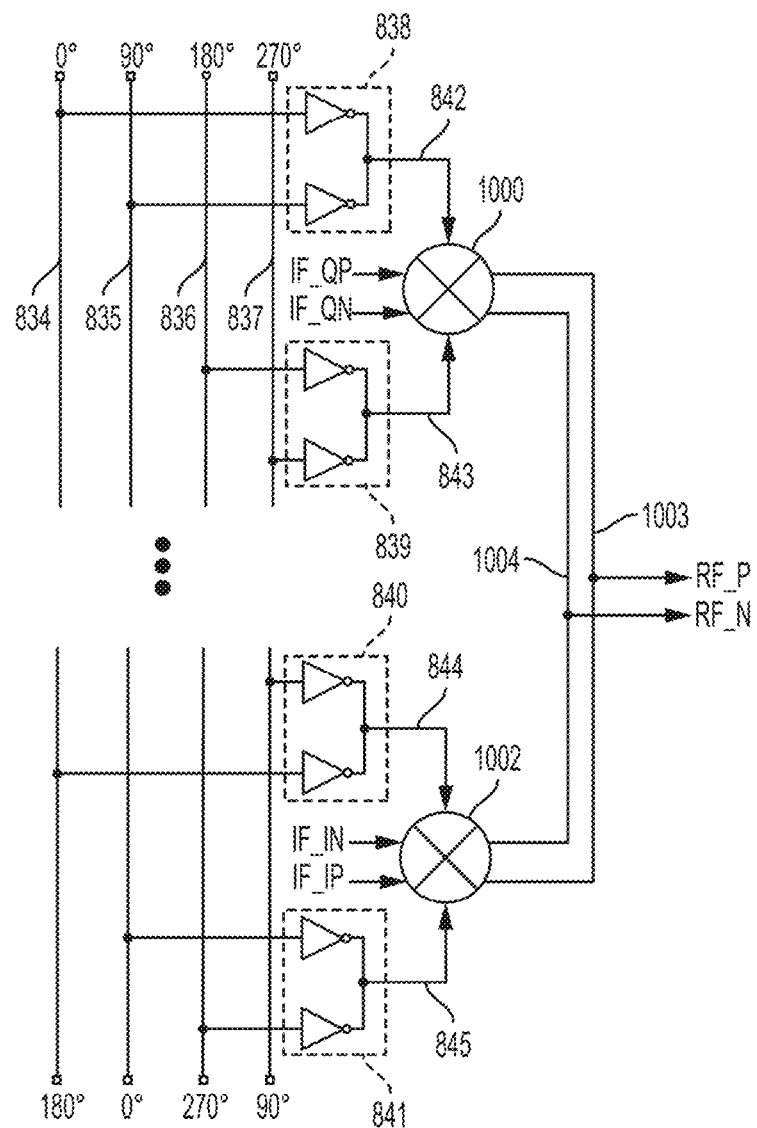
FIG. 10 is diagram showing a portion of an example transmitter circuit that uses the local oscillator shown in FIGS. 7 and 8.

FIG. 10 is diagram showing a portion of an example transmitter circuit that uses the local oscillator shown in FIGS. 7 and 8. In the example shown in FIG. 10, a first mixer 1000 has a positive IF quadrature input node IF_QP and a negative IF quadrature input node IF_QN (e.g., that may be coupled to BB/IIF-stage circuitry). The first mixer 1000 further has a first reference signal input node that is coupled to the positive quadrature local oscillator reference signal output node (LO_QP) 842 and a second reference signal input node that is coupled to the negative quadrature local oscillator reference signal output node (LO_QN) 843. A second mixer 1002 has a positive IF in-phase input node IF_IP and a negative IF in-phase input node IF_IN (e.g., that may be coupled to IF-stage circuitry). The second mixer 1002 has a first reference signal input node that is coupled to the positive in-phase local oscillator reference signal output node (LO_IP) 845 and a second reference signal input node that is coupled to the negative in-phase local oscillator reference signal output node (LO_IN) 844. First outputs of the first mixer 1000 and the second mixer 1002 are coupled together to form a positive RF output node (RF_P) 1003 (e.g., that may be coupled through RF-stage circuitry to an antenna). Second outputs of the first mixer 1000 and the second mixer 1002 are coupled together to form a negative RF output node (RF_N) 1004 (e.g., that may be coupled through RF-stage circuitry to an antenna).

As further examples, the following lines may be matched: lines between the output nodes 842, 843 of the first duty-cycle converter 838 and the second duty-cycle converter 839 and the input nodes of the first mixer 1000; lines between the output nodes 844, 845 of the third duty-cycle converter 840 and the fourth duty-cycle converter 841 and the input nodes of the second mixer 1002; lines to input nodes IF_IP, IF_IN, IF_QP, and IF_QN of the first mixer 1000 and the second mixer 1002; and lines from the output nodes RF_P and RF_N of the first mixer 1000 and the second mixer 1002.

In some aspects of operation, the differential quadrature local oscillator reference signal is output from the first duty-cycle converter 838 and the second duty-cycle converter 839 on the positive quadrature local oscillator reference signal output node (LO_QP) 842 and the negative quadrature local oscillator reference signal output node (LO_QN) 843, respectively, and input into the first mixer 1000. The first mixer 1000 receives a differential IF quadrature signal on the positive IF quadrature input node IF_QP and the negative IF quadrature input node IF_QN. The first mixer 1000 then uses the differential quadrature local oscillator reference signal to up-convert the differential IF quadrature signal to a differential RF signal that is output on the positive RF output node (RF_P) 1003 and the negative RF output node (RF_N) 1004. In some aspects of operation, the differential in-phase local oscillator reference signal is output from the fourth duty-cycle converter 841 and the third duty-cycle converter 840 on the positive in-phase local oscillator reference signal output node (LO_IP) 845 and the negative in-phase local oscillator reference signal output node (LO_IN) 844, respectively, and input into the second mixer 1002. The second mixer 1002 receives a differential IF in-phase signal on the positive IF in-phase input node IF_IP and the negative IF in-phase input node IF_IN. The second mixer 1002 then uses the differential in-phase local oscillator reference signal to up-convert the differential IF in-phase signal to a differential RF signal that is output on the positive RF output node (RF_P) 1003 and the negative RF output node (RF_N) 1004.

Figure 11:
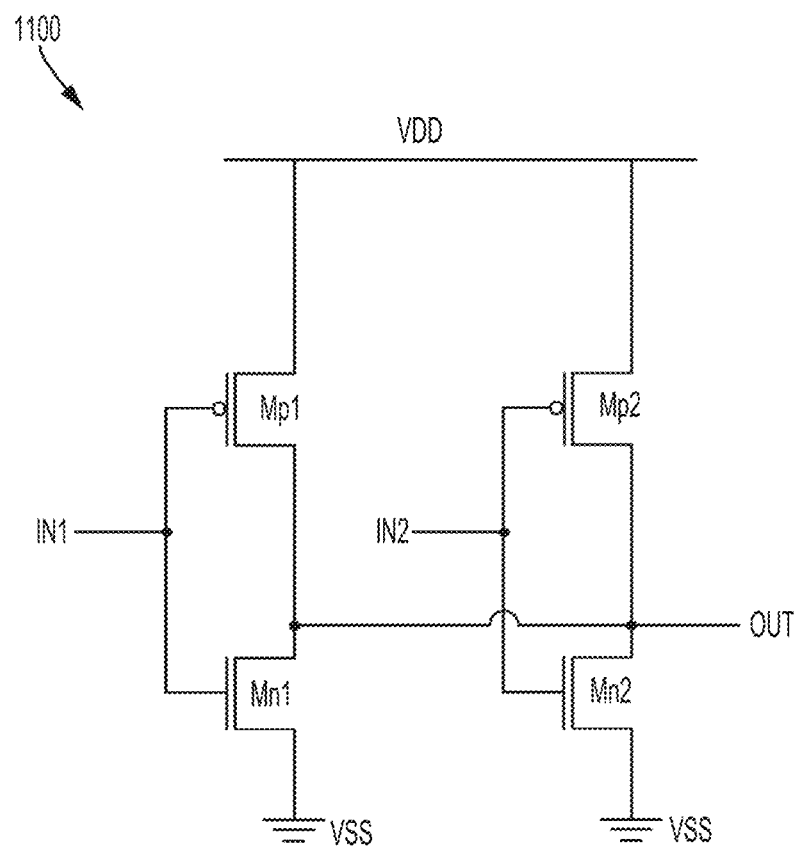
FIG. 11 is a diagram showing an example circuit implementation of a duty-cycle converter.

FIG. 11 is a diagram showing an example circuit implementation 1100 of a duty-cycle converter. In some implementations, the duty-cycle converters 838, 839, 840, and 841 shown in FIGS. 8, 9 and 10 can be implemented according to the example shown in FIG. 11, or the duty-cycle converters 838, 839, 840, and 841 shown in FIGS. 8, 9 and 10 can be implemented in another manner.

The example circuit implementation 1100 shown in FIG. 11 includes symmetric NOR logic circuitry. As shown in FIG. 11, the example circuit implementation 1100 includes a first p-type transistor (e.g., a p-type MOSFET) Mp1, a second p-type transistor (e.g., a p-type MOSFET) Mp2, a first n-type transistor (e.g., an n-type MOSFET) Mn1, and a second n-type transistor (e.g., an n-type MOSFET) Mn2. The gates of the first p-type transistor Mp1 and the first n-type transistor Mn1 are connected together and form a first input node IN1 of the duty cycle converter. A source of the first p-type transistor Mp1 is coupled to a positive power supply node VDD, and a source of the first n-type transistor Mn1 is coupled to a negative power supply node VSS. The gates of the second p-type transistor Mp2 and the second n-type transistor Mn2 are connected together and form a second input node IN2 of the duty cycle converter. A source of the second p-type transistor Mp2 is coupled to the positive power supply node VDD, and a source of the second n-type transistor Mn2 is coupled to a negative power supply node VSS. The drains of the first p-type transistor Mp1, the first n-type transistor Mn1, the second p-type transistor Mp2, and the second n-type transistor Mn2 are connected together and form an output node OUT of the duty cycle converter.

In the example shown in FIG. 11, the first p-type transistor Mp1 and the first n-type transistor Mn1 form the first inverter INV1 of the duty-cycle converters 838, 839, 840, and 841, and the second p-type transistor Mp2 and the second n-type transistor Mn2 form the second inverter INV2 of the duty-cycle converters 838, 839, 840, and 841. In operation, the example circuit implementation 1100 acts as a NOR gate. The relatively small number of transistors in this example circuit implementation 1100 may, in some instances, allow the circuit to have a fast response time for high frequency applications. Further, the example circuit implementation 1100 may, in some instances, allow for a wider output swing capability in high frequency applications, which can also allow for an improved phase-noise specification.

Figure 12:
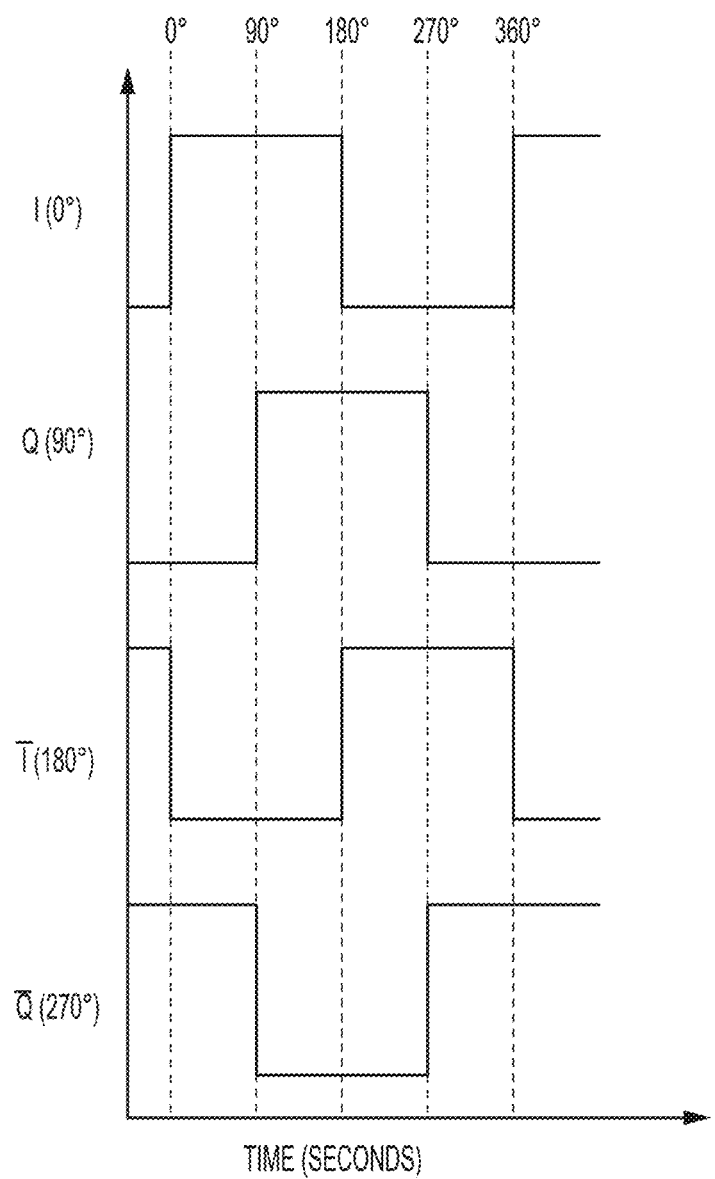
FIG. 12 is a plot showing example signals on the bus of FIG. 8.

FIG. 12 is a plot showing example signals on the bus of FIG. 8. FIG. 12 shows an in-phase signal I(0°) that is carried on the first bus line 834; a quadrature signal Q(90°) that is 90° out of phase from the in-phase signal I(0°) and is carried on the second bus line 835; a complementary in-phase signal $\bar{I}$(180°) that is 180° out of phase from the in-phase signal) I(0°) and is carried on the third bus line 836; and a complementary quadrature signal) $\bar{Q}$(270°) that is 270° out of phase from the in-phase signal I(0°) and that is carried on the fourth bus line 837. These signals can be output from the second frequency divider 816 or the third frequency divider 817 through respective switches to the first bus line 834, second bus line 835, third bus line 836, and fourth bus line 837 as discussed above. The example signals shown in FIG. 11 have fifty percent (50%) duty-cycles.

Figure 13:
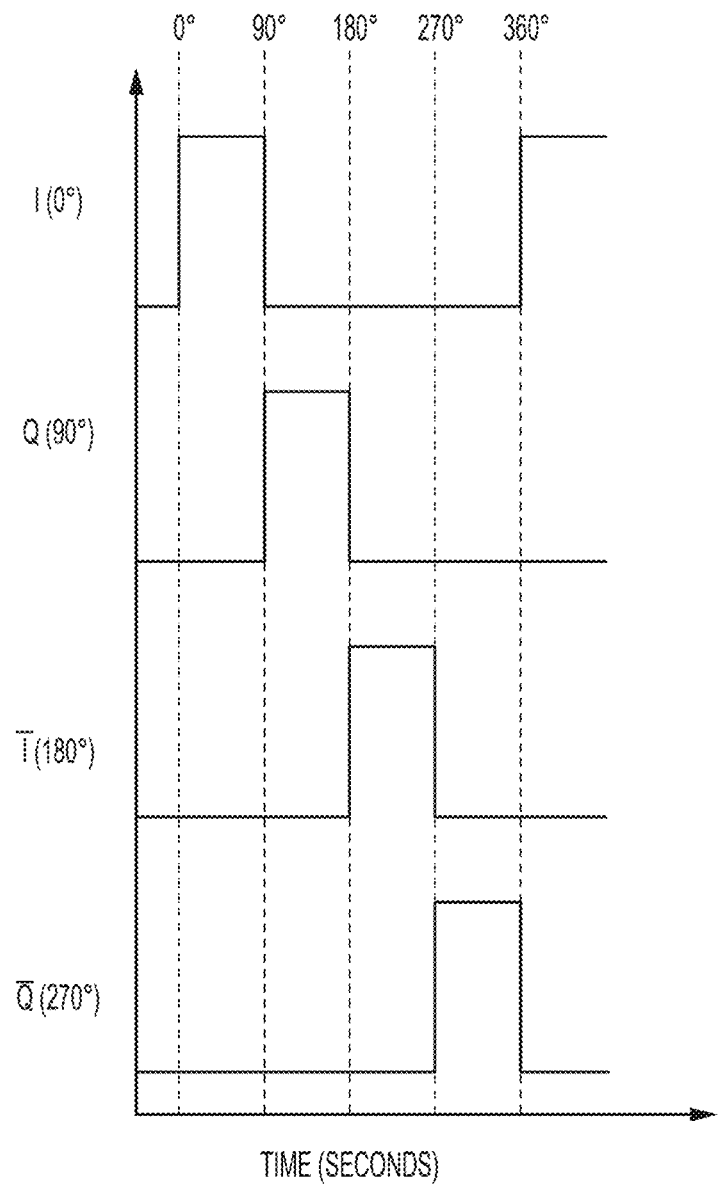
FIG. 13 is a plot showing example signals output from the duty-cycle converters of FIG. 8.

FIG. 13 is a plot showing example signals output from the duty-cycle converters of FIG. 8. The example signals shown in FIG. 13 have twenty-five percent (25%) duty-cycles. FIG. 13 shows a converted in-phase signal I(0°) that is output by the fourth duty-cycle converter 841 by NORing (applying the NOR Boolean logic operation) the in-phase signal I(0°) that is carried on the first bus line 834 and the complementary quadrature signal $\bar{Q}$(270°) that is carried on the fourth bus line 837; a converted quadrature signal Q(90°) that is output by the first duty-cycle converter 838 by NORing the quadrature signal Q(90°) that is carried on the second bus line 835 and the in-phase signal I(0°) that is carried on the first bus line 834; a converted complementary in-phase signal $\bar{I}$(180°) that is output by the third duty-cycle converter 840 by NORing the complementary in-phase signal) $\bar{I}$(180°) that is carried on the third bus line 836 and the quadrature signal Q(90°) that is carried on the second bus line 835; and a converted complementary quadrature signal $\bar{Q}$(270°) that is output by the second duty-cycle converter 839 by NORing the complementary quadrature signal $\bar{Q}$(270°) that is carried on the fourth bus line 837 and the complementary in-phase signal $\bar{I}$(180°) that is carried on the third bus line 836.

In a general aspect, local oscillators have been described. In some examples, the local oscillators includes features or components that provide one or more advantages, as described above.

In a first example, a wireless sensor device includes an antenna, a mixer, and a local oscillator. The antenna is configured to wirelessly communicate a wireless signal. The mixer is communicatively coupled to the antenna. The local oscillator includes a voltage controlled oscillator, a multi-stage frequency divider, and a duty-cycle converter. An output node of the voltage controlled oscillator is communicatively coupled to an input node of a first stage of the multi-stage frequency divider. An output node of the first stage of the multi-stage frequency divider is communicatively coupled to an input node of a second stage of the multi-stage frequency divider. The first stage of the multi-stage frequency divider is configured to selectively output to the output node of the first stage of the multi-stage frequency divider a first signal from at least one of a first plurality of signal paths, where each of the first plurality of signal paths is configured to provide a signal having a distinct frequency (different from the frequencies of signals provided the other signal paths). The second stage of the multi-stage frequency divider is configured to output to an output node of the second stage of the multi-stage frequency divider a second signal from at least one of a second plurality of signal paths, where each of the second plurality of signal paths is configured to provide a signal having a distinct frequency (different from the frequencies of signals provided the other signal paths). An output node of the multi-stage frequency divider is communicatively coupled to an input node of the duty-cycle converter. An output node of the duty-cycle converter is communicatively coupled to an input node of the mixer.

Implementations of the first example may, in some cases, include one or more of the following features. The antenna may be configured to receive the wireless signal and send a radio-frequency signal to the mixer through a radio-frequency node, and the mixer may be configured to down-convert the radio-frequency signal. The antenna may be configured to transmit the wireless signal and receive a radio-frequency signal from the mixer through a radio-frequency node, and the mixer may be configured to up-convert a signal to the radio-frequency signal.

Implementations of the first example may, in some cases, include one or more of the following features. The duty-cycle converter may be configured to output a reference signal having a twenty-five percent duty-cycle. The duty-cycle converter may comprise a first inverter having a first input node and a second inverter having a second input node, and a first output node of the first inverter may be communicatively coupled to a second output node of the second inverter to form the output node of the duty-cycle converter. The voltage controlled oscillator may be configured to output a differential original reference signal; the multi-stage frequency divider may be configured to output a differential divided reference signal; and the duty-cycle converter may be configured to output a differential duty-cycle converted signal.

Implementations of the first example may, in some cases, include one or more of the following features. The first stage of the multi-stage frequency divider may comprise a first signal path and a second signal path of the first plurality of signal paths, and the second stage of the multi-stage frequency divider may comprise a third signal path and a fourth signal path of the second plurality of signal paths. The first signal path of the first plurality of signal paths has a first switch and is configured to output a signal. The second signal path of the first plurality of signal paths has a second switch. The second signal path is configured to divide the frequency of the input signal input on the input node of the first stage by a second divisor that is greater than one to form a second divided signal. The first switch and the second switch are configured such that one is open when the other is closed to selectively output the signal from the first signal path or the second divided signal as the first signal. The third signal path of the second plurality of signal paths has a third switch. The third signal path is configured to divide a frequency of an input signal input on the input node of the second stage by a third divisor that is greater than one to form a third divided signal. The fourth signal path of the second plurality of signal paths has a fourth switch. The fourth signal path is configured to divide the frequency of the input signal input on the input node of the second stage by a fourth divisor that is greater than one to form a fourth divided signal. The third divisor is different from the fourth divisor. The third switch and the fourth switch are configured such that one is open when the other is closed to selectively output the third divided signal or the fourth divided signal as the second signal.

In a second example, a local oscillator includes a voltage controlled oscillator, a multi-stage frequency divider, and a duty-cycle converter. The multi-stage frequency divider comprises a first stage and a second stage. The first stage comprises a first input node configured to receive a first reference signal from the voltage controlled oscillator, one or more first switches configured to receive a first control signal, and first stage circuitry configured to generate a second reference signal from the first reference signal. The first reference signal has a first radio frequency, and the second reference signal has a second radio frequency that is a quotient of the first radio frequency and a first divisor controlled by the first control signal. The second stage comprises a second input node configured to receive the second reference signal from the first stage, one or more second switches configured to receive a second control signal, and second stage circuitry configured to generate a third reference signal from the second reference signal. The third reference signal has a third radio frequency that is a quotient of the second radio frequency and a second divisor controlled by the second control signal. The duty-cycle converter is configured to receive an output of the multi-stage frequency divider.

Implementations of the second example may, in some cases, include one or more of the following features. The duty-cycle converter may be configured to receive a differential output of the multi-stage frequency divider, and the duty-cycle converter may comprise a first inverter having a third input node configured to receive a positive signal of the differential output, and may comprise a second inverter having a fourth input node configured to receive a negative signal of the differential output. A first output node of the first inverter is communicatively coupled to a second output node of the second inverter to form an output node of the duty-cycle converter. The first inverter may comprise a first p-type transistor and a first n-type transistor, and the second inverter may comprise a second p-type transistor and a second n-type transistor. The first p-type transistor has a source operatively coupled to a first power supply node, and the first n-type transistor has a source operatively coupled to a second power supply node. A gate of the first p-type transistor and a gate of the first n-type transistor are operatively coupled together as the third input node of the first inverter. The second p-type transistor has a source operatively coupled to the first power supply node, and the second n-type transistor has a source operatively coupled to the second power supply node. A gate of the second p-type transistor and a second of the second n-type transistor are operatively coupled together as the fourth input node of the second inverter. Respective drains of the first p-type transistor, the first n-type transistor, the second p-type transistor, and the second n-type transistor are operatively coupled together as the output node of the duty-cycle converter.

Implementations of the second example may, in some cases, include one or more of the following features. The duty-cycle converter may be configured to output a reference signal having a twenty-five percent duty-cycle. The first reference signal may be a differential first reference signal; the second reference signal may be a differential second reference signal; and the third reference signal may be a differential third reference signal.

Implementations of the second example may, in some cases, include one or more of the following features. The first stage of the multi-stage frequency divider may comprise a first signal path and a second signal path, and the second stage of the multi-stage frequency divider may comprise a third signal path and a fourth signal path. The first signal path is communicatively coupled to the first input node and comprises a first switch of the one or more first switches. The first switch is controllable by the first control signal. The second signal path is communicatively coupled to the first input node and comprises a first frequency divider and a second switch of the one or more first switches. The first frequency divider is configured to divide the first radio frequency of the first reference signal by a third divisor that is greater than one. The second switch is controllable by a complementary signal of the first control signal. A first path signal from the first signal path or a second path signal from the second signal path is the second reference signal based on controlling the first switch and the second switch. The third signal path is communicatively coupled to the second input node and comprises a second frequency divider and a third switch of the one or more second switches. The second frequency divider is configured to divide the second radio frequency of the second reference signal by a fourth divisor that is greater than one. The third switch is controllable by the second control signal. The fourth signal path is communicatively coupled to the second input node and comprises a third frequency divider and a fourth switch of the one or more second switches. The third frequency divider is configured to divide the second radio frequency of the second reference signal by a fifth divisor that is greater than one and different from the fourth divisor. The fourth switch being controllable by a third control signal. A third path signal from the third signal path or a fourth path signal from the fourth signal path is the third reference signal based on controlling the third switch and the fourth switch.

In a third example, an original reference signal is output from a voltage controlled oscillator to an input node of a first stage of a multi-stage frequency divider; outputting a first stage reference signal from the first stage of the multi-stage frequency divider to an input node of a second stage of the multi-stage frequency divider, and outputting a second stage reference signal from the second stage of the multi-stage frequency divider. The first stage reference signal is selected from first signal paths in the first stage of the multi-stage frequency divider, and the first signal paths are configured to produce signals with distinct frequencies. The second stage reference signal is selected from second signal paths in the second stage of the multi-stage frequency divider, and the second signal paths are configured to produce signals with distinct frequencies.

Implementations of the third example may, in some cases, include one or more of the following features. The second stage reference signal is input to an input node of a duty-cycle converter; and outputting a duty-cycle converted second stage reference signal from an output node of the duty-cycle converter. A low frequency signal is up-converted to a radio frequency signal using the duty-cycle converted second stage reference signal. A radio frequency signal is down-converted to a low frequency signal using the duty-cycle converted second stage reference signal. The second stage reference signal may have a duty-cycle of approximately 50%, and the duty-cycle converted second stage reference signal may have a duty-cycle of approximately 25%. The duty-cycle converter may comprise a first inverter and a second inverter, and an output of the first inverter and an output of the second inverter may be communicatively coupled together as the output node of the duty-cycle converter. Each of the first inverter and the second inverter may comprise a p-type transistor and an n-type transistor. The p-type transistor has a source operatively coupled to a first power supply node. The n-type transistor has a source operatively coupled to a second power supply node. A gate of the p-type transistor and a gate of the n-type transistor are operatively coupled together, and a drain of the p-type transistor and a drain of the n-type transistor are operatively coupled together.

In a fourth example, a wireless sensor device includes an antenna, a mixer and a local oscillator. The antenna is configured to wirelessly communicate a wireless signal, and the mixer is communicatively coupled to the antenna. The local oscillator includes a voltage controlled oscillator (VCO), a frequency divider circuit and a duty-cycle converter communicatively coupled between the mixer and the frequency divider circuit. The frequency divider circuit is communicatively coupled between the VCO and the duty-cycle converter. The frequency divider circuit includes an input node configured to receive a VCO signal from the VCO; switches configured to receive respective control signals; and circuitry configured to generate a reference signal from the VCO signal. The VCO signal has a VCO frequency, and the reference signal has a reference signal frequency that is a quotient of the VCO frequency and a divisor controlled by the control signals.

Implementations of the fourth example may, in some cases, include one or more of the following features. The frequency divider circuit is implemented as a multi-stage frequency divider. The multi-stage frequency divider includes a first stage configured to selectively output a first signal from at least one of a first plurality of signal paths, each of the first plurality of signal paths being configured to provide a signal having a distinct frequency. The multi-stage frequency divider includes a second stage configured to selectively output a second signal from at least one of a second plurality of signal paths, each of the second plurality of signal paths being configured to provide a signal having a distinct frequency.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented separately or in any suitable subcombination.

A number of examples have been described. Nevertheless, it will be understood that various modifications can be made. Accordingly, other implementations are within the scope of the following claims.

What is claimed is:

1. A wireless sensor device comprising:
   an antenna configured to wirelessly communicate a wireless signal;
   a mixer communicatively coupled to the antenna; and
   a local oscillator comprising:
      a voltage controlled oscillator;
      a multi-stage frequency divider, an output node of the voltage controlled oscillator being communicatively coupled to an input node of a first stage of the multi-stage frequency divider, an output node of the first stage of the multi-stage frequency divider being communicatively coupled to an input node of a second stage of the multi-stage frequency divider, the first stage of the multi-stage frequency divider being configured to selectively output to the output node of the first stage of the multi-stage frequency divider a first signal from at least one of a first plurality of signal paths, each of the first plurality of signal paths being configured to provide a signal having a distinct frequency, the second stage of the multi-stage frequency divider being configured to selectively output to an output node of the second stage of the multi-stage frequency divider a second signal from at least one of a second plurality of signal paths, each of the second plurality of signal paths being configured to provide a signal having a distinct frequency, wherein:
         the first stage of the multi-stage frequency divider comprises:
            a first signal path of the first plurality of signal paths having a first switch; and
            a second signal path of the first plurality of signal paths having a second switch, the second signal path being configured to divide the frequency of the input signal input on the input node of the first stage by a second divisor to form a second divided signal, the first switch and the second switch being configured such that one is open when the other is closed to selectively output the first divided signal or the second divided signal as the first signal; and
         the second stage of the multi-stage frequency divider comprises:
            a third signal path of the second plurality of signal paths having a third switch, the third signal path being configured to divide a frequency of an input signal input on the input node of the second stage by a third divisor to form a third divided signal; and
a fourth signal path of the second plurality of signal paths having a fourth switch, the fourth signal path being configured to divide the frequency of the input signal input on the input node of the second stage by a fourth divisor to form a fourth divided signal, the third divisor being different from the fourth divisor, the third switch and the fourth switch being configured such that one is open when the other is closed to selectively output the third divided signal or the fourth divided signal as the second signal; and
a duty-cycle converter, an output node of the multi-stage frequency divider being communicatively coupled to an input node of the duty-cycle converter, an output node of the duty-cycle converter being communicatively coupled to an input node of the mixer.

2. The wireless sensor device of claim 1, wherein the antenna is configured to receive the wireless signal and send a radio-frequency signal to the mixer through a radio-frequency node, the mixer being configured to down-convert the radio-frequency signal.

3. The wireless sensor device of claim 1, wherein the antenna is configured to transmit the wireless signal and receive a radio-frequency signal from the mixer through a radio-frequency node, the mixer being configured to up-convert a signal to the radio-frequency signal.

4. The wireless sensor device of claim 1, wherein the duty-cycle converter is configured to output a reference signal having a twenty-five percent duty-cycle.

5. The wireless sensor device of claim 1, wherein the duty-cycle converter comprises a first inverter having a first input node and a second inverter having a second input node, a first output node of the first inverter being communicatively coupled to a second output node of the second inverter to form the output node of the duty-cycle converter.

6. The wireless sensor device of claim 1, wherein the voltage controlled oscillator is configured to output a differential original reference signal, the multi-stage frequency divider is configured to output a differential divided reference signal, and the duty-cycle converter is configured to output a differential duty-cycle converted signal.

7. A local oscillator comprising:
a voltage controlled oscillator;
a multi-stage frequency divider comprising:
a first stage comprising:
a first input node configured to receive a first reference signal from the voltage controlled oscillator, the first reference signal having a first frequency; and
one or more first switches configured to receive a first control signal;
first stage circuitry configured to generate a second reference signal from the first reference signal, the second reference signal having a second frequency that is a quotient of the first frequency and a first divisor controlled by the first control signal; and
a second stage comprising:
a second input node configured to receive the second reference signal from the first stage;
one or more second switches configured to receive a second control signal; and
second stage circuitry configured to generate a third reference signal from the second reference signal, the third reference signal having a third frequency that is a quotient of the second frequency and a second divisor controlled by the second control signal; and
a duty-cycle converter configured to receive a differential output of the multi-stage frequency divider, the duty-cycle converter comprising:
a first inverter having a third input node configured to receive a positive signal of the differential output; and
a second inverter having a fourth input node configured to receive a negative signal of the differential output, a first output node of the first inverter being communicatively coupled to a second output node of the second inverter to form an output node of the duty-cycle converter.

8. The local oscillator of claim 7, wherein the duty-cycle converter is configured to output a reference signal having a twenty-five percent duty-cycle.

9. The local oscillator of claim 7, wherein:
the first inverter comprises:
a first p-type transistor having a source operatively coupled to a first power supply node; and
a first n-type transistor having a source operatively coupled to a second power supply node, a gate of the first p-type transistor and a gate of the first n-type transistor being operatively coupled together as the third input node of the first inverter; and
the second inverter comprises:
a second p-type transistor having a source operatively coupled to the first power supply node; and
a second n-type transistor having a source operatively coupled to the second power supply node, a gate of the second p-type transistor and a second of the second n-type transistor being operatively coupled together as the fourth input node of the second inverter, respective drains of the first p-type transistor, the first n-type transistor, the second p-type transistor, and the second n-type transistor being operatively coupled together as the output node of the duty-cycle converter.

10. The local oscillator of claim 7, wherein the first reference signal is a differential first reference signal, the second reference signal is a differential second reference signal, and the third reference signal is a differential third reference signal.

11. The local oscillator of claim 7, wherein:
the first stage of the multi-stage frequency divider comprises:
a first signal path communicatively coupled to the first input node and comprising a first switch of the one or more first switches, the first switch being controllable by the first control signal; and
a second signal path communicatively coupled to the first input node and comprising a first frequency divider and a second switch of the one or more first switches; and
the second stage of the multi-stage frequency divider comprises:
a third signal path communicatively coupled to the second input node and comprising a second frequency divider and a third switch of the one or more second switches; and a fourth signal path communicatively coupled to the second input node and comprising a third frequency divider and a fourth switch of the one or more second switches.

12. A method comprising:
outputting an original reference signal from a voltage controlled oscillator to an input node of a first stage of a multi-stage frequency divider;
outputting a first stage reference signal from the first stage of the multi-stage frequency divider to an input node of a second stage of the multi-stage frequency divider, the first stage reference signal being selected from first signal paths in the first stage of the multi-stage frequency divider, the first signal paths being configured to produce signals with distinct frequencies; and
outputting a second stage reference signal from the second stage of the multi-stage frequency divider, the second stage reference signal being selected from second signal paths in the second stage of the multi-stage frequency divider, the second signal paths being configured to produce signals with distinct frequencies;
inputting the second stage reference signal to an input node of a duty-cycle converter, the duty-cycle converter comprising a first inverter and a second inverter, an output of the first inverter and an output of the second inverter being communicatively coupled together as an output node of the duty-cycle converter, each of the first inverter and the second inverter comprising:
a p-type transistor having a source operatively coupled to a first power supply node; and
an n-type transistor having a source operatively coupled to a second power supply node, a gate of the p-type transistor and a gate of the n-type transistor being operatively coupled together, a drain of the p-type transistor and a drain of the n-type transistor being operatively coupled together; and
outputting a duty-cycle converted second stage reference signal from the output node of the duty-cycle converter.

13. The method of claim 12, further comprising up-converting a low frequency signal to a radio frequency signal using the duty-cycle converted second stage reference signal.

14. The method of claim 12, further comprising down-converting a radio frequency signal to a low frequency signal using the duty-cycle converted second stage reference signal.

15. The method of claim 12, wherein the second stage reference signal has a duty-cycle of 50%, and the duty-cycle converted second stage reference signal has a duty-cycle of 25%.

16. A wireless sensor device comprising:
an antenna configured to wirelessly communicate a wireless signal;
a mixer communicatively coupled to the antenna; and
the local oscillator comprising:
a voltage controlled oscillator (VCO);
a duty-cycle converter communicatively coupled to the mixer, the duty-cycle converter comprising a first inverter and a second inverter, an output of the first inverter and an output of the second inverter being communicatively coupled together as an output node of the duty-cycle converter, each of the first inverter and the second inverter comprising:
a p-type transistor having a source operatively coupled to a first power supply node; and
an n-type transistor having a source operatively coupled to a second power supply node, a gate of the p-type transistor and a gate of the n-type transistor being operatively coupled together, a drain of the p-type transistor and a drain of the n-type transistor being operatively coupled together; and
a frequency divider circuit communicatively coupled between the VCO and the duty-cycle converter, the frequency divider circuit comprising:
an input node configured to receive a VCO signal from the VCO, the VCO signal having a VCO frequency; and
switches configured to receive respective control signals; and
circuitry configured to generate a reference signal from the VCO signal, the reference signal having a reference signal frequency that is a quotient of the VCO frequency and a divisor controlled by the control signals.

17. The wireless sensor device of claim 16, wherein the frequency divider circuit comprises a multi-stage frequency divider.

18. The wireless sensor device of claim 17, wherein the multi-stage frequency divider comprises:
a first stage configured to selectively output a first signal from at least one of a first plurality of signal paths, each of the first plurality of signal paths being configured to provide a signal having a distinct frequency; and
a second stage configured to selectively output a second signal from at least one of a second plurality of signal paths, each of the second plurality of signal paths being configured to provide a signal having a distinct frequency.

19. The wireless sensor device of claim 5, wherein each of the first inverter and the second inverter comprises:
a p-type transistor having a source operatively coupled to a first power supply node; and
an n-type transistor having a source operatively coupled to a second power supply node, a gate of the p-type transistor and a gate of the n-type transistor being operatively coupled together, a drain of the p-type transistor and a drain of the n-type transistor being operatively coupled together.

* * * * *